(12) United States Patent
Kim et al.

(10) Patent No.: US 9,941,243 B2
(45) Date of Patent: Apr. 10, 2018

(54) WAFER-TO-WAFER BONDING STRUCTURE

(71) Applicant: Samsung Electronics Co., Ltd., Suwon-si, Gyeonggi-do (KR)

(72) Inventors: Tae-yeong Kim, Yongin-si (KR); Pil-kyu Kang, Hwaseong-si (KR); Seok-ho Kim, Hwaseong-si (KR); Kwang-jin Moon, Hwaseong-si (KR); Ho-jin Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/413,824

(22) Filed: Jan. 24, 2017

(65) Prior Publication Data

US 2017/0358553 A1 Dec. 14, 2017

(30) Foreign Application Priority Data

Jun. 9, 2016 (KR) .................. 10-2016-0071736

(51) Int. Cl.
*H01L 23/52* (2006.01)
*H01L 23/00* (2006.01)

(52) U.S. Cl.
CPC .............. *H01L 24/94* (2013.01); *H01L 24/02* (2013.01); *H01L 24/05* (2013.01); *H01L 24/29* (2013.01); *H01L 24/83* (2013.01); *H01L 24/92* (2013.01); *H01L 2224/02215* (2013.01); *H01L 2224/04105* (2013.01); *H01L 2224/05147* (2013.01); *H01L 2224/29187* (2013.01); *H01L 2224/29188* (2013.01); *H01L 2224/8012* (2013.01); *H01L 2224/8312* (2013.01); *H01L 2224/83896* (2013.01); *H01L 2224/9211* (2013.01); *H01L 2924/0537* (2013.01);
(Continued)

(58) Field of Classification Search
CPC ......... H01L 24/29; H01L 24/05; H01L 24/02; H01L 24/83; H01L 24/91; H01L 24/92; H01L 24/94
USPC ......................................... 257/751
See application file for complete search history.

(56) References Cited

U.S. PATENT DOCUMENTS 8,008,184 B2  8/2011  Matsumoto et al.
8,349,725 B2  1/2013  Sato et al.
(Continued)

FOREIGN PATENT DOCUMENTS

JP    2007/059660 A    3/2007
KR    10-0538381 B1   12/2005
KR    10-0919378 B1    9/2009

*Primary Examiner* — Luan C Thai
(74) *Attorney, Agent, or Firm* — Harness, Dickey & Pierce, P.L.C.

(57) ABSTRACT

A wafer-to-wafer bonding structure includes a first wafer including a first conductive pad in a first insulating layer and a first barrier layer surrounding a lower surface and side surfaces of the first conductive pad, a second wafer including a second conductive pad in a second insulating layer and a second barrier layer surrounding a lower surface and side surfaces of the second conductive pad, the second insulating layer being bonded to the first insulating layer, and at least a portion of an upper surface of the second conductive pad being partially or entirely bonded to at least a portion of an upper surface of the first conductive pad, and a third barrier layer between portions of the first and second wafers where the first and second conductive pads are not bonded to each other.

20 Claims, 17 Drawing Sheets

(52) U.S. Cl.
CPC ............... *H01L 2924/0549* (2013.01); *H01L 2924/05432* (2013.01); *H01L 2924/05442* (2013.01); *H01L 2924/365* (2013.01)

(56) References Cited

U.S. PATENT DOCUMENTS

| | | | |
|---|---|---|---|
| 8,372,745 B2 | 2/2013 | Koike | |
| 8,766,342 B2 | 7/2014 | Akolkar | |
| 8,896,125 B2 * | 11/2014 | Kagawa | H01L 21/76807 257/774 |
| 9,142,517 B2 * | 9/2015 | Liu | H01L 24/80 |
| 9,147,650 B2 | 9/2015 | Hagimoto et al. | |
| 9,269,680 B2 | 2/2016 | Okuyama | |
| 9,520,361 B2 * | 12/2016 | Kang | H01L 27/14621 |

\* cited by examiner

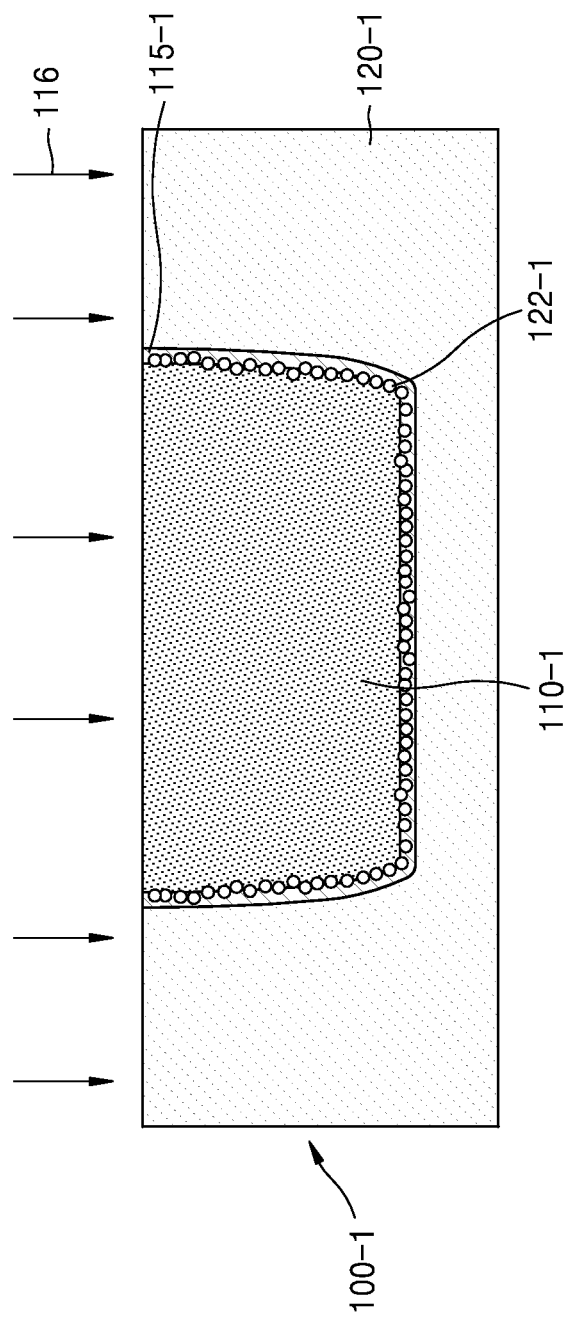

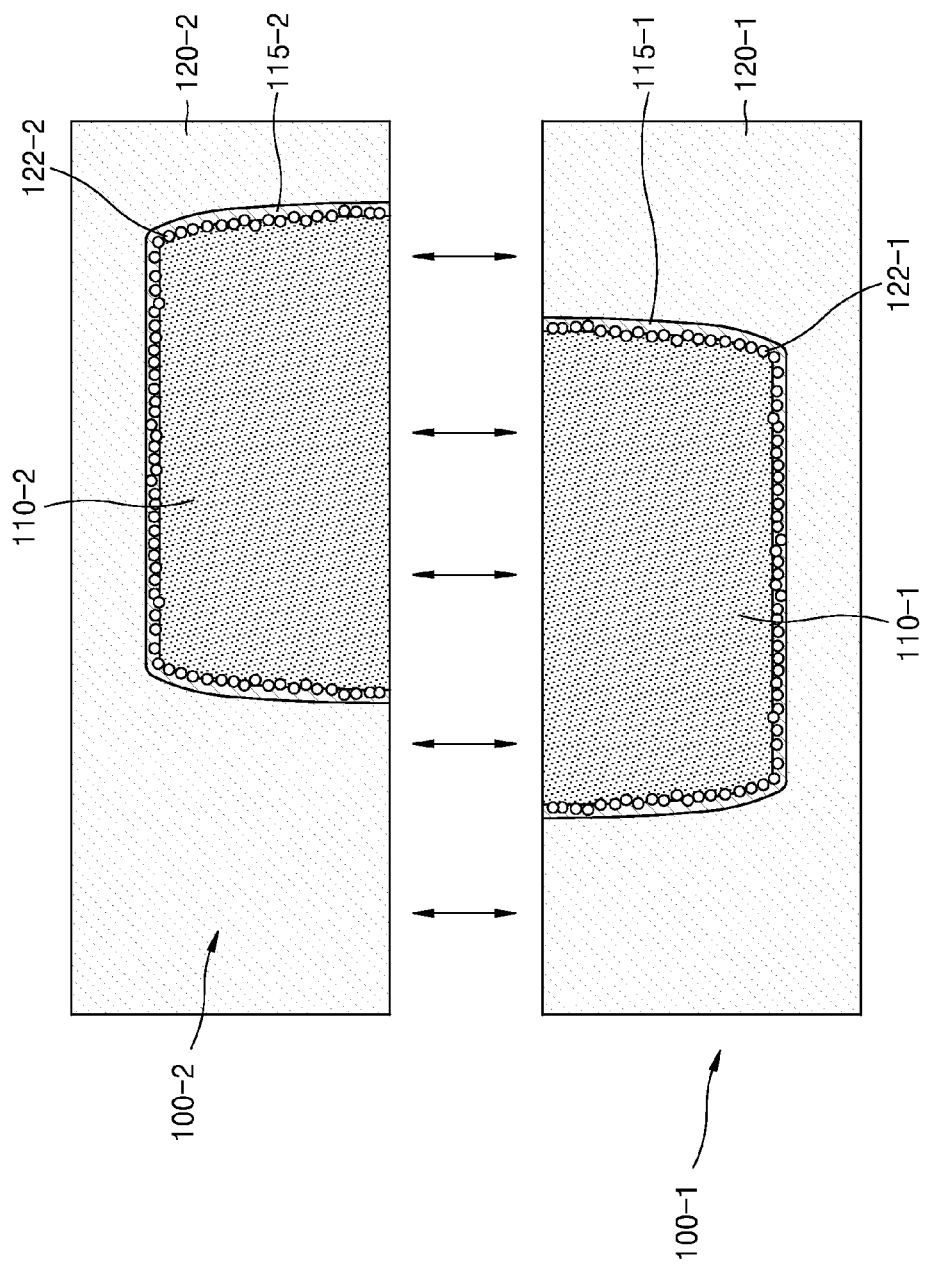

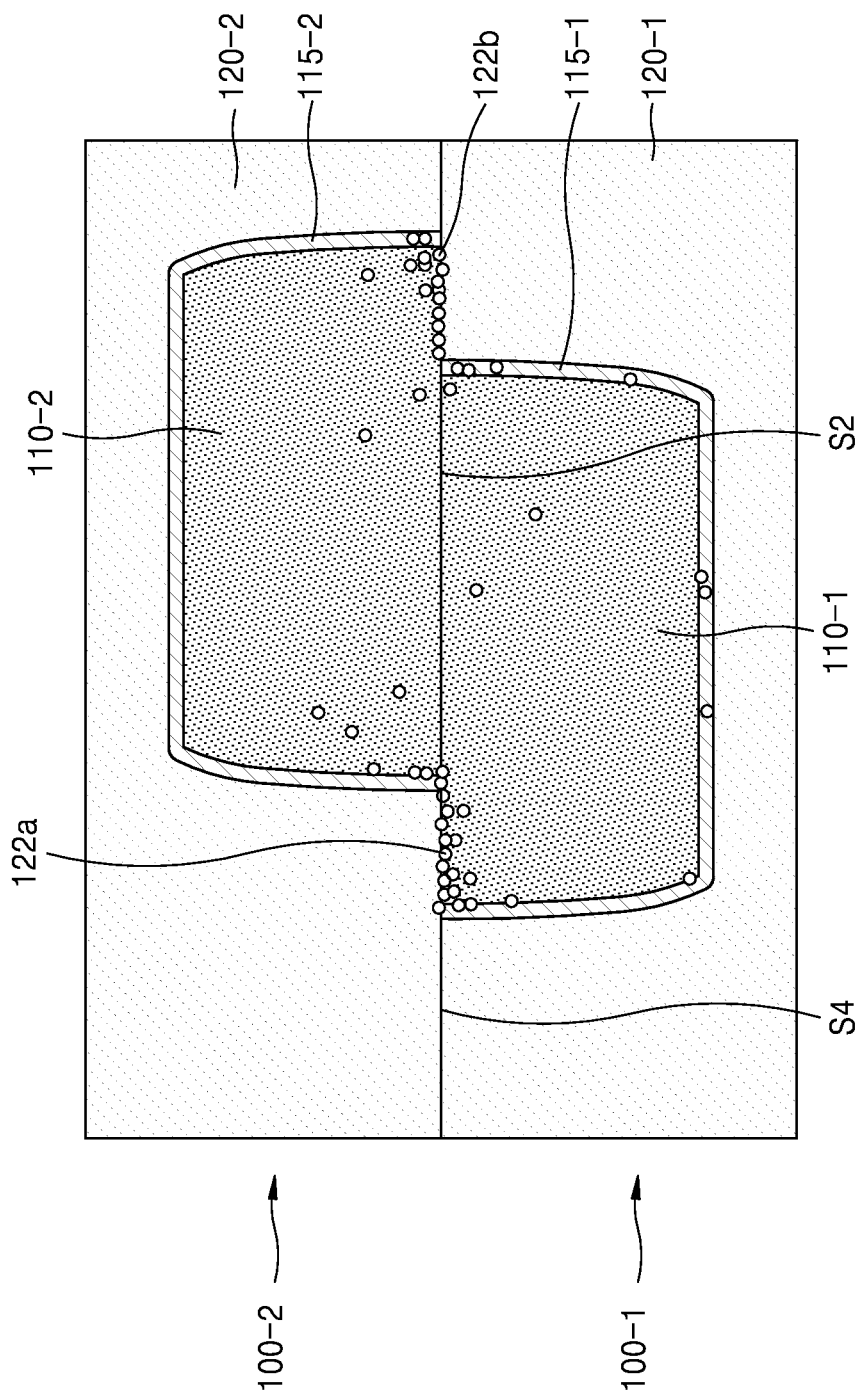

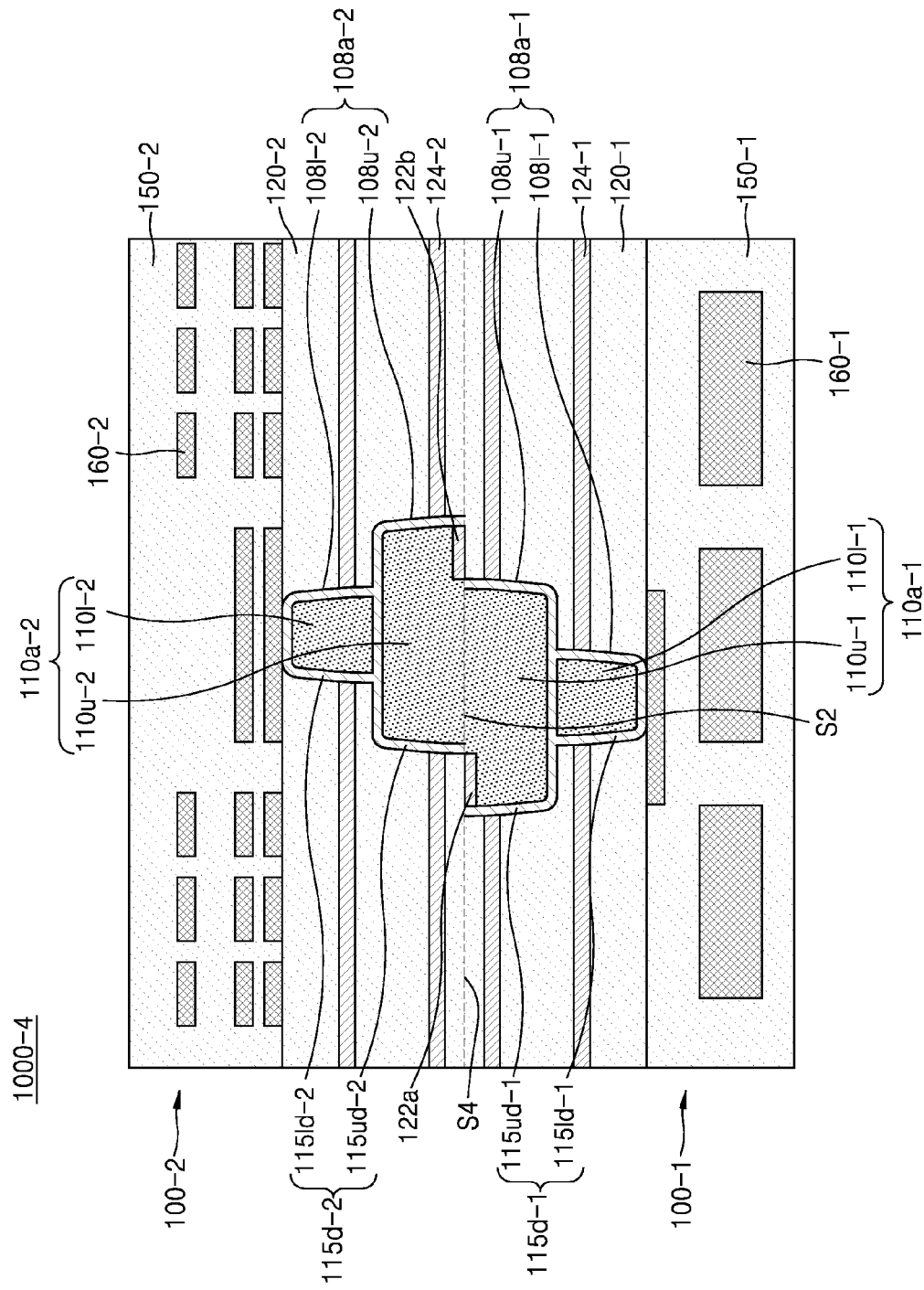

WAFER-TO-WAFER BONDING STRUCTURE

CROSS-REFERENCE TO RELATED APPLICATION

This application claims the benefit of Korean Patent Application No. 10-2016-0071736, filed on Jun. 9, 2016, in the Korean Intellectual Property Office, the disclosure of which is incorporated herein in its entirety by reference.

BACKGROUND

1. Field

Example embodiments of the inventive concepts relates to a wafer-to-wafer bonding structure, and more particularly, to a wafer-to-wafer bonding structure in which wafers including conductive pads formed in an insulating layer are bonded to each other.

2. Description of the Related Art

When forming a semiconductor chip, wafers may be bonded to each other for various purposes, for example, to improve an integration degree or a function of the semiconductor chip. Conductive pads formed on an upper surface of each wafer, for example, copper (Cu) pads may be bonded to each other for electrical connection of wafers. However, a misalignment may occur between the conductive pads while bonding wafers, and thus, metal elements included in the conductive pads may diffuse through an adjacent insulating layer during a heat treatment process.

SUMMARY

Example embodiments of the inventive concepts provides a wafer-to-wafer bonding structure reducing or preventing metal elements included in conductive pads from being diffused through an adjacent insulating layer when wafers including the conductive pads are bonded to each other.

According to example embodiments of the inventive concepts, a wafer-to-wafer bonding structure includes a first wafer including a first conductive pad in a first insulating layer and a first barrier layer surrounding a lower surface and side surfaces of the first conductive pad, a second wafer including a second conductive pad in a second insulating layer and a second barrier layer surrounding a lower surface and side surfaces of the second conductive pad, the second insulating layer being bonded to the first insulating layer, and at least a portion of an upper surface of the second conductive pad being partially or entirely bonded to at least a portion of an upper surface of the first conductive pad, and a third barrier layer between the first and second wafers where the first and second conductive pads are not bonded to each other.

According to example embodiments of the inventive concepts, a wafer-to-wafer bonding structure a first wafer including a first semiconductor layer, a first multi-layered wiring layer on the first semiconductor layer, a first insulating layer on the first multi-layered wiring layer, a first conductive pad penetrating the first insulating layer, and a first barrier layer surrounding the first conductive pad, and a second wafer including a second insulating layer on the first insulating layer, the second insulating layer bonded to the first insulating layer, a second conductive pad penetrating the second insulating layer and bonded to a portion of the first conductive pad, a second barrier layer surrounding the second conductive pad, a second multi-layered wiring layer on the second insulating layer and the second conductive pad, and a second semiconductor layer on the second multi-layered wiring layer, and a third barrier layer between portions of the first and second wafers where the first and second conductive pads not bonded to each other.

According to example embodiments of the inventive concepts, a bonding structure includes a first wafer including a first insulating layer and a first conductive pad embedded in the first insulating layer, a second wafer bonded to the first wafer, the second wafer including a second insulating layer and a second conductive pad embedded in the second insulating layer, the second conductive pad overlapping a portion of the first conductive pad such that the first and second conductive pads are not vertically aligned, and a barrier metal layer on an interface between the first and second wafers where the first and second conductive pads do not overlap.

BRIEF DESCRIPTION OF THE DRAWINGS

Example embodiments of the inventive concepts will be more clearly understood from the following detailed description taken in conjunction with the accompanying drawings in which:

FIGS. 2A to 2E are cross-sectional views of a main part illustrating a manufacturing method of a wafer-to-wafer bonding structure, according to example embodiments of the inventive concepts;

FIG. 6 is a main view illustrating a wafer-to-wafer bonding structure according to example embodiments of the inventive concepts;

DETAILED DESCRIPTION

Reference will now be made in detail to embodiments, examples of which are illustrated in the accompanying drawings.

Figure 1A:
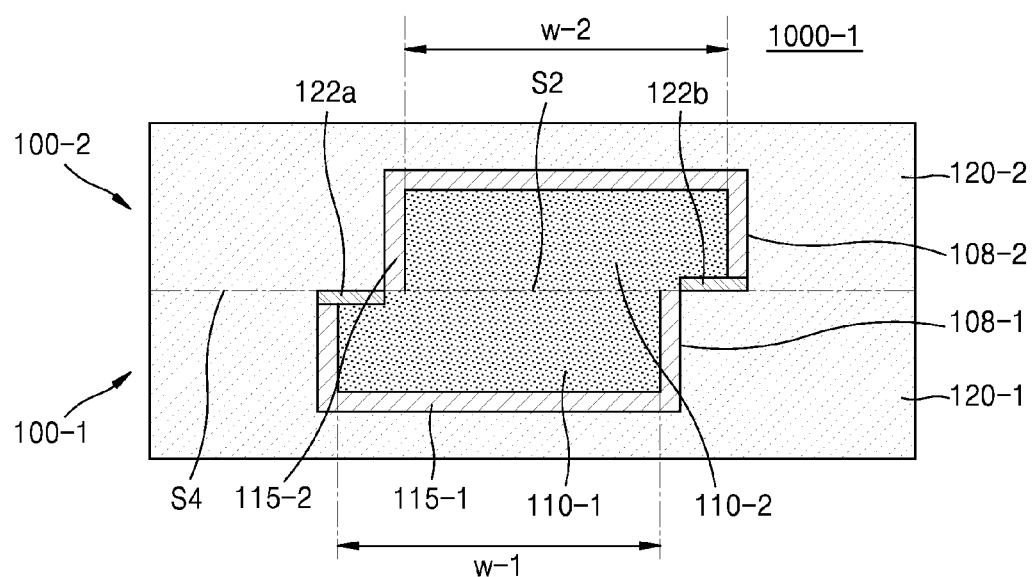
FIGS. 1A and 1B are main views illustrating a wafer-to-wafer bonding structure according to example embodiments of the inventive concepts.
Figure 1B:
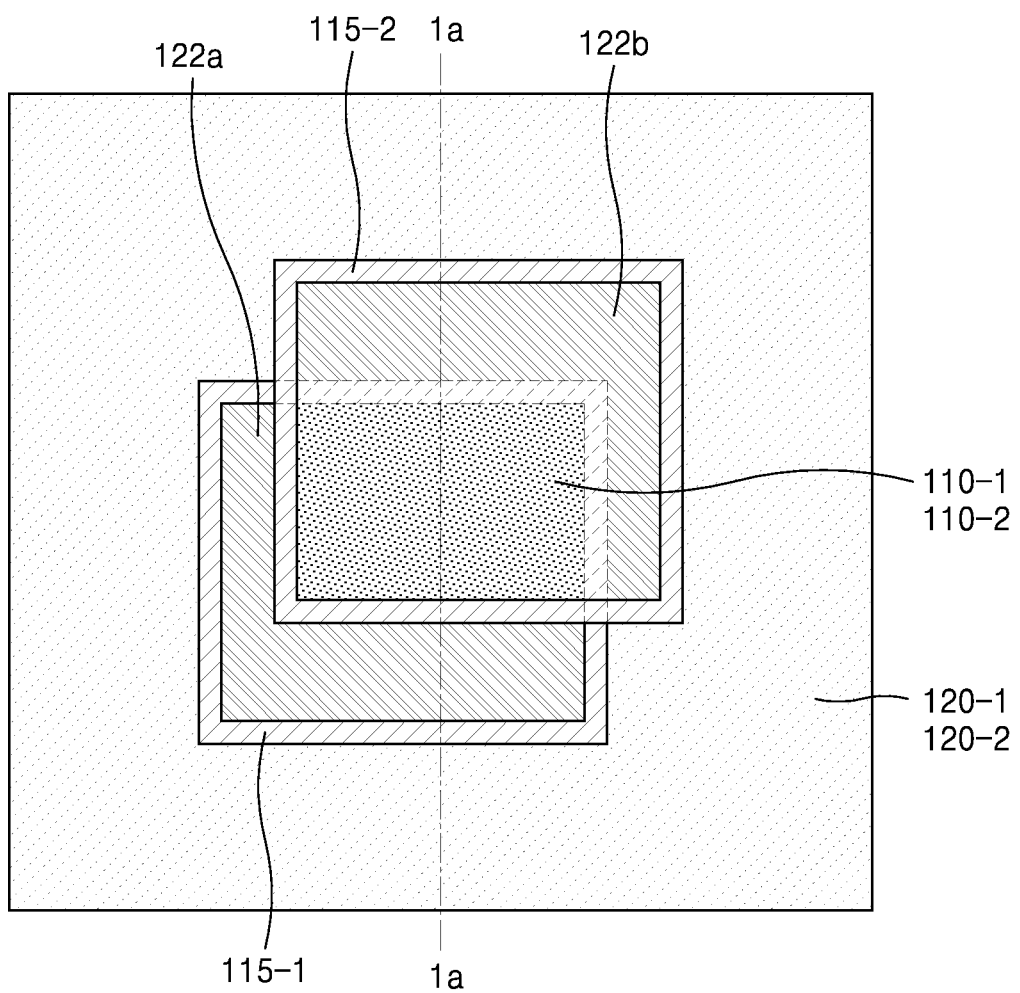

FIGS. 1A and 1B are main views illustrating a wafer-to-wafer bonding structure 1000-1 according to example embodiments of the inventive concepts.

In more detail, FIGS. 1A and 1B are a cross-sectional view and a transparent plan view of the wafer-to-wafer bonding structure 1000-1, respectively. FIG. 1A may be a cross-sectional view taken along a line 1a-1a of FIG. 1B. The wafer-to-wafer bonding structure 1000-1 may include a bonding structure of a first wafer 100-1 and a second wafer 100-2.

The first wafer 100-1 may include a first insulating layer 120-1, a first conductive pad 110-1, and a first barrier layer 115-1. The first insulating layer 120-1 may be a first bonding insulating layer. The first insulating layer 120-1 may include a silicon nitride layer and/or a silicon oxide layer. The first insulating layer 120-1 may include a single layer or layers. The first insulating layer 120-1 may have a multilayer structure in which a silicon nitride layer and a silicon oxide layer are alternately stacked.

The first insulating layer 120-1 may include a first silicon carbon nitride (SiCN) layer, a first tetraethyl orthosilicate (TEOS) layer, and a second SiCN layer that are sequentially stacked. The first insulating layer 120-1 may include the first SiCN layer, the first TEOS layer, the second SiCN layer, and a second TEOS layer. Furthermore, the first insulating layer 120-1 may be variously formed. The first insulating layer 120-1 will be described in detail later below.

Meanwhile, the first insulating layer 120-1 may be formed on a substrate (not shown). The substrate may include, for example, an integrated circuit (IC) layer (not shown) and a multi-layered wiring layer (not shown). An interlayer insulating layer (not shown) may be between the IC layer and the multi-layered wiring layer, and between multi-layered wiring layers, respectively. Furthermore, the uppermost wiring layer of the multi-layered wiring layers may be electrically connected to the first conductive pad 110-1 through a vertical contact (not shown) penetrating through the first insulating layer 120-1, or by being directly connected to the first barrier layer 115-1. The IC layer and the multi-layered wiring layers will be described in detail later below.

The first conductive pad 110-1 may be a copper (Cu) pad. A part of the first conductive pad 110-1 may be embedded in a first via trench 108-1 formed in the first insulating layer 120-1. An upper surface of the first conductive pad 110-1 may be exposed and a lower surface and side surfaces of the first conductive pad 110-1 may be surrounded by the first barrier layer 115-1. In other words, an upper surface S2 of the first conductive pad 110-1 may have an open (exposed) structure from the first wafer 100-1 point of view.

A shape of the first conductive pad 110-1 may be a column. However, a shape of the first conductive pad 110-1 is not limited thereto. The first conductive pad 110-1 may be an elliptical column, a polygonal column, and so on. A width w-1 of the first conductive pad 110-1 may be various sizes, for example, about 1 to 20 μm.

The first barrier layer 115-1 may surround the lower surface and the side surfaces of the first conductive pad 110-1. The first barrier layer 115-1 may be formed in an inner wall of the first via trench 108-1 in the first insulating layer 120-1. The first barrier layer 115-1 may reduce or prevent a metal forming the first conductive pad 110-1, for example, Cu, from being diffused. The first barrier layer 115-1 may include one or at least two layered structures selected from titanium (Ti), tantalum (Ta), titanium nitride (TiN), and tantalum nitride (TaN). However, materials of the first barrier layer 115-1 are not limited thereto. The first barrier layer 115-1 may be denoted as a first barrier metal layer.

The first barrier layer 115-1 formed on the side surfaces of the first conductive pad 110-1 may be the same height as the first conductive pad 110-1. The upper surface S2 of the first conductive pad 110-1 and an upper surface S4 of the first insulating layer 120-1 may be flush with each other.

The second wafer 100-2 may include a second insulating layer 120-2, a second conductive pad 110-2, and a second barrier layer 115-2 corresponding to the first wafer 100-1. In other words, the second insulating layer 120-2, the second conductive pad 110-2, and the second barrier layer 115-2 of the second wafer 100-2 may correspond to the first insulating layer 120-1, the first conductive pad 110-1, and the first barrier layer 115-1 of the first wafer 100-1, respectively. The second wafer 100-2 may be bonded to the first wafer 100-1. The second insulating layer 120-2 may be a second bonding insulating layer.

In more detail, the second conductive pad 110-2 may be a Cu pad. The second barrier layer 115-2 may be denoted as a second barrier metal layer. The second conductive pad 110-2 may be embedded in a second via trench 108-2 formed in the second insulating layer 120-2. A lower surface and side surfaces of the second conductive pad 110-1 may be surrounded by the second barrier layer 115-2. An upper surface S2 of the second conductive pad 110-2 may have an open (exposed) structure from the second wafer 100-2 point of view.

The upper surface S2 of the second conductive pad 110-2 and an upper surface S4 of the second insulating layer 120-2 may be flush with each other. The second barrier layer 115-2 may be formed in an inner wall of the second via trench 108-2 in the second insulating layer 120-2. Structures or materials of the second insulating layer 120-2, the second conductive pad 110-2, and the second barrier layer 115-2 may be the same as those of the first insulating layer 120-1, the first conductive pad 110-1, and the first barrier layer 115-1 of the first wafer 100-1. Therefore, a detailed description thereof will not be given.

The second insulating layer 120-2 is bonded to the first insulating layer 120-1, and the upper surface S2 of the second conductive pad 110-2 and the upper surface S2 of the first conductive pad 110-1 are partially bonded to each other. The upper surface S4 of the first insulating layer 120-1 and the upper surface S4 of the second insulating layer 120-2 between the first and second wafers 100-1 and 100-2 may be plasma-activated surfaces.

Since the upper surface S4 of the first insulating layer 120-1 and the upper surface S4 of the second insulating layer 120-2 are plasma-activated surfaces, the first and second wafers 100-1 and 100-2 may be bonded to each other through a heat treatment. A width w-2 of the second conductive pad 110-2 may be the same size as the width w-1 of the first conductive pad 110-1. The second conductive pad 110-2 may not be vertically aligned with the first conductive pad 110-1, as illustrated in FIG. 1A. The second conductive pad 110-2 may partially overlap the first conductive pad 110-1 as illustrated in FIG. 1B.

Third barrier layers 122a and 122b may be arranged in a part where the first and second conductive pads 110-1 and 110-2 are not bonded to each other, between the first and second wafers 100-1 and 100-2. The third barrier layers 122a and 122b may be between the second insulating layer 120-2 and the first conductive pad 110-1 which is not bonded to the second conductive pad 110-2, and the first insulating layer 120-1 and the second conductive pad 110-2 which is not bonded to the first conductive pad 110-1. As illustrated in FIG. 1B, the third barrier layers 122a and 122b may be around part of the first conductive pad 110-1 and around part of the second conductive pad 110-2.

The third barrier layers 122a and 122b may reduce or prevent a metal forming the first and second conductive pads 110-1 and 110-2, for example, Cu, from being diffused. The third barrier layers 122a and 122b may be self-forming barrier layers.

When the first and second conductive pads 110-1 and 110-2 are formed of Cu and the first and second insulating layers 120-1 and 120-2 include a silicon oxide layer, the third barrier layers 122a and 122b may be formed of a metal more prone to oxidize than Cu forming the first and second conductive pads 110-1 and 110-2, for example, manganese (Mn) or aluminum (Al), and silicon (Si). The third barrier layers 122a and 122b may be MnSiO layers or AlSiO layers. However, materials of the third barrier layers 122a and 122b are not limited thereto. A forming process of the third barrier layers 122a and 122b will be described in detail later below.

The wafer-to-wafer bonding structure 1000-1 may have a structure in which the first and second wafers 100-1 and 100-2 are bonded to each other, through hybrid bonding, that is, bonding between the first and second conductive pads 110-1 and 110-2, bonding between the first and second insulating layers 120-1 and 120-2, bonding between the third barrier layers 122a and 122b and the second insulating layer 120-2, and bonding between the third barrier layers 122a and 122b and the first insulating layer 120-1.

In other words, in the wafer-to-wafer bonding structure 1000-1, the upper surface S2 of the first conductive pad 110-1 and the upper surface S2 of the second conductive pad 110-2 may be bonded to each other, the upper surface S4 of the first insulating layer 120-1 and the upper surface S4 of the second insulating layer 120-2 may be bonded to each other, and the third barrier layers 122a and 122b may be located in a part where the first and second conductive pads 110-1 and 110-2 are not bonded to each other.

The wafer-to-wafer bonding structure 1000-1 may reduce or prevent metal elements in the first and second conductive pads 110-1 and 110-2 from being diffused through the first and second insulating layers 120-1 and 120-2 by positioning the third barrier layers 122a and 122b between the first and second conductive pads 110-1 and 110-2 and the first and second insulating layers 120-1 and 120-2. Therefore, the wafer-to-wafer bonding structure 1000-1 may improve leakage characteristics of an electric element.

In FIGS. 1A and 1B, the first wafer 100-1 may be classified as including the first insulating layer 120-1, the first conductive pad 110-1, and the first and third barrier layers 115-1 and 122a. However, the third barrier layer 122a may be classified as a separate component between the first and second wafers 100-1 and 100-2. Furthermore, the second wafer 100-2 may be classified as including the second insulating layer 120-2, the second conductive pad 110-2, and the second and third barrier layers 115-2 and 122b. However, the third barrier layer 122b may be classified as a separate component between the first and second wafers 100-1 and 100-2.

FIGS. 2A to 2E are cross-sectional views of a main part illustrating a manufacturing method of a wafer-to-wafer bonding structure, according to example embodiments of the inventive concepts. FIGS. 2A to 2E may be an example embodiment of a manufacturing method of the wafer-to-wafer bonding structure 1000-1 of FIGS. 1A and 1B. In FIGS. 2A to 2E, like reference numerals in FIGS. 1A and 1B denote like elements, and repeated descriptions thereof are omitted for simplicity.

Figure 2A:
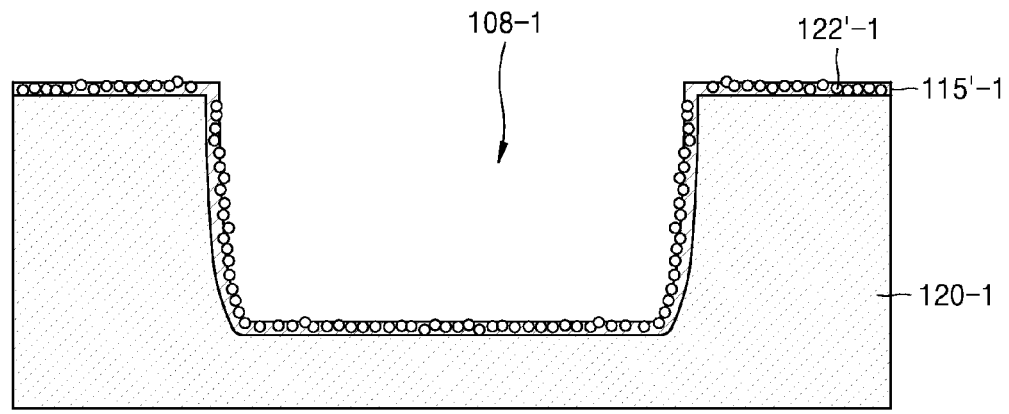

Referring to FIG. 2A, the first insulating layer 120-1 is formed on a substrate (not shown). Materials forming the first insulating layer 120-1 are as described above and thus omitted. The first via trench 108-1 may be formed by patterning a part of the first insulating layer 120-1. The first via trench 108-1 may be defined as a via hole. A preliminary first barrier layer 115'-1 may be formed on the inner wall of the first via trench 108-1 and the first insulating layer 120-1. A material forming the preliminary first barrier layer 115'-1 may be the same as that of the first barrier layer 115-1 described above.

Next, a preliminary first seed layer 122'-1 may be formed on the preliminary first barrier layer 115'-1. The preliminary first seed layer 122'-1 may be formed of a metal more prone to oxidize than Cu forming the following first conductive pad 110-1, for example, Mn or Al. The preliminary first seed layer 122'-1 may be a CuMn alloy layer or a CuAl alloy layer. Atom concentration of Mn or Al included in Cu of the preliminary first seed layer 122'-1 may be 0.5% to 20%. FIG. 2A illustrates that the preliminary first seed layer 122'-1 is formed of a plurality of metal atoms for convenience of following descriptions.

Figure 2B:
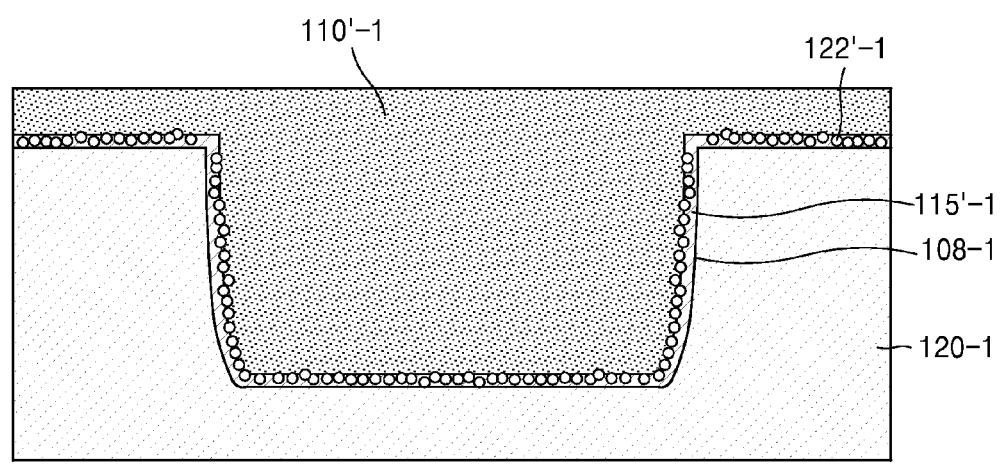

Referring to FIG. 2B, a preliminary first conductive pad 110'-1 may be formed on the preliminary first seed layer 122'-1 and in the first via trench 108-1. The preliminary first conductive pad 110'-1 may be formed of the same material as the following first conductive pad 110-1, for example, Cu. The preliminary first conductive pad 110'-1 may be formed by plating or physical vapor deposition (PVD).

Referring to FIG. 2C, with the first insulating layer 120-1 as an etching blocking layer, the preliminary first conductive pad 110'-1, the preliminary first seed layer 122'-1, and the preliminary first barrier layer 115'-1 may be flattened through a chemical mechanical polishing (CMP) process. Therefore, the first conductive pad 110-1, a first seed layer 122-1, and the first barrier layer 115-1 are formed. The upper surface of the first conductive pad 110-1 may be exposed and the lower surface and side surfaces of the first conductive pad 110-1 may be surrounded by the first seed layer 122-1 and the first barrier layer 115-1.

Next, in order to easily perform a following bonding process, plasma 116 may be irradiated to front sides of the first insulating layer 120-1, the first conductive pad 110-1, the first seed layer 122-1, and the first barrier layer 115-1 by using argon gas or nitrogen gas. Therefore, upper surfaces of the first insulating layer 120-1 and the first conductive pad 110-1 may be plasma-activated surfaces. The first wafer 100-1 may be manufactured through the process.

Referring to FIG. 2D, the second wafer 100-2 may be manufactured through the same process as those of FIGS. 2A to 2C. The second wafer 100-2 may include the second insulating layer 120-2, the second conductive pad 110-2, the second seed layer 122-2, and the second barrier layer 115-2. The first conductive pad 110-1 and the first insulating layer 120-1 of the first wafer 100-1 may be bonded to the second conductive pad 110-2 and the second insulating layer 120-2 of the second wafer 100-2 to face one another. FIG. 2D illustrates the first and second wafers 100-1 and 100-2 facing each other.

Referring to FIG. 2E, the first conductive pad 110-1 and the first insulating layer 120-1 of the first wafer 100-1 are bonded to the second conductive pad 110-2 and the second insulating layer 120-2 of the second wafer 100-2 to face one another, and a heat treatment is performed thereon.

The upper surface S2 of the first conductive pad 110-1 and the upper surface S2 of the second conductive pad 110-2 are bonded to each other, and the upper surface S4 of the first insulating layer 120-1 and the upper surface S4 of the second insulating layer 120-2 are bonded to each other. When the first conductive pad 110-1 of the first wafer 100-1 is bonded to the second conductive pad 110-2 of the second wafer 100-2, the first conductive pad 110-1 of the first wafer 100-1 may be to one side, for example, to the left side of the second conductive pad 110-2 of the second wafer 100-2 and not accurately aligned therewith.

A heat treatment may be performed at a temperature at which bonding between the first and second insulating layers 120-1 and 120-2, and bonding between the first and second conductive pads 110-1 and 110-2 may be performed. For example, a temperature of the heat treatment may be about 180° C. to 300° C. During the heat treatment, as illustrated in FIG. 2E, the third barrier layers 122a and 122b may be formed in a part where the first and second conductive pads 110-1 and 110-2 are not bonded to each other, between the first and second wafers 100-1 and 100-2.

The third barrier layers 122a and 122b may be the self-forming barrier layer described above. Metal atoms forming the first and second seed layers 122-1 and 122-2 are segregated after moving to a surface of the first and second insulating layers 120-1 and 120-2, and react with the first and second insulating layers 120-1 and 120-2, to thereby form the self-forming barrier layer forming the third barrier layers 122a and 122b. As described above, the third barrier layers 122a and 122b may reduce or prevent metal atoms included in the first and second conductive pads 110-1 and 110-2, for example, Cu atoms from being diffused through the first and second insulating layers 120-1 and 120-2.

FIGS. 3A to 3F are cross-sectional views of a main part illustrating a manufacturing method of a wafer-to-wafer bonding structure, according to example embodiments of the inventive concepts. FIGS. 3A to 3F may be an example embodiment of a manufacturing method of the wafer-to-wafer bonding structure 1000-1 of FIGS. 1A and 1B. In FIGS. 3A to 3F, like reference numerals in FIGS. 1A and 1B, and FIGS. 2A to 2E denote like elements, and repeated descriptions thereof are omitted for simplicity.

Figure 3A:
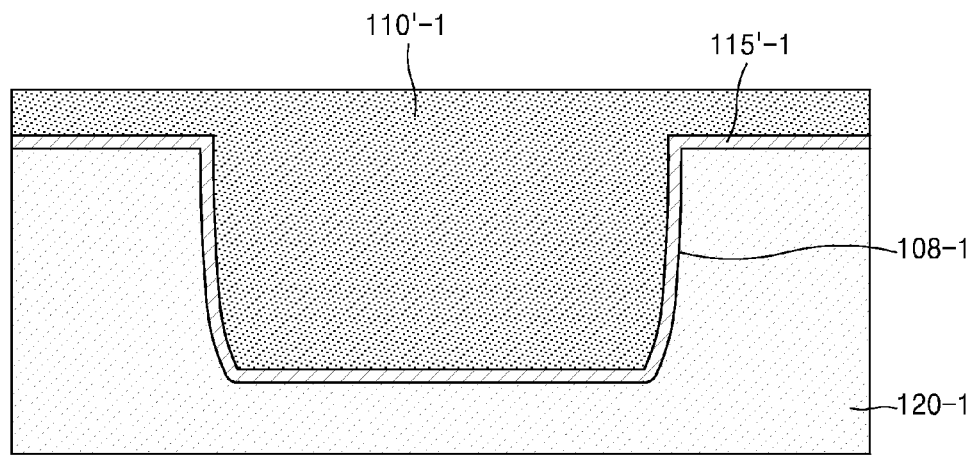
FIGS. 3A to 3F are cross-sectional views of a main part illustrating a manufacturing method of a wafer-to-wafer bonding structure, according to example embodiments of the inventive concepts.

Referring to FIG. 3A, the first insulating layer 120-1 may be formed on a substrate (not shown) and the first via trench 108-1 may be formed in the first insulating layer 120-1 as described above. The first via trench 108-1 may be defined as a via hole. A preliminary first barrier layer 115'-1 may be formed on the inner wall of the first via trench 108-1 and the first insulating layer 120-1.

The preliminary first conductive pad 110'-1 may be formed on the preliminary first seed layer 122'-1 and in the first via trench 108-1. The preliminary first conductive pad 110'-1 may be formed of the same material as the following first conductive pad 110-1, for example, Cu.

Figure 3B:
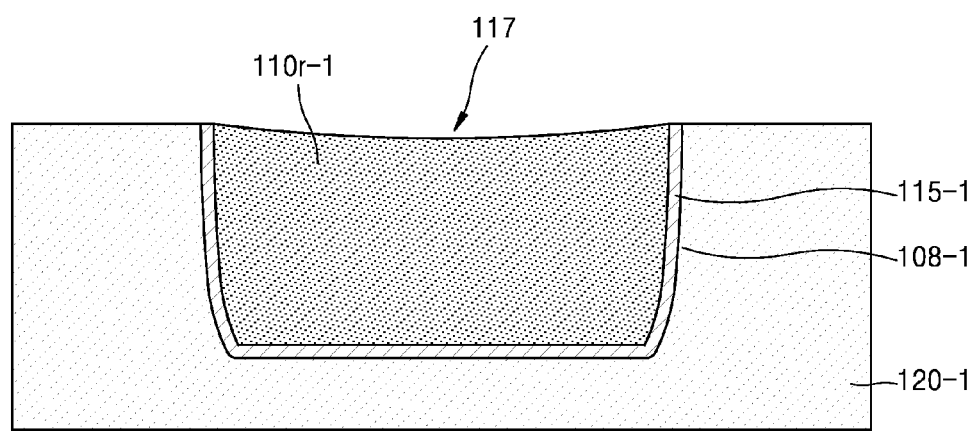

Referring to FIG. 3B, with the first insulating layer 120-1 as an etching blocking point, the preliminary first conductive pad 110'-1 and the preliminary first barrier layer 115'-1 may be flattened through a CMP process. Next, the first conductive pad 110'-1 may be further recessed in the preliminary first via trench 108-1 and a recessed first conductive pad 110r-1 may be formed. Therefore, the recessed first conductive pad 110r-1 and the first barrier layer 115-1 may be formed. An upper surface of the recessed first conductive pad 110r-1 may be exposed and a lower surface and side surfaces of the recessed first conductive pad 110r-1 may be surrounded by the first barrier layer 115-1.

Figure 3C:
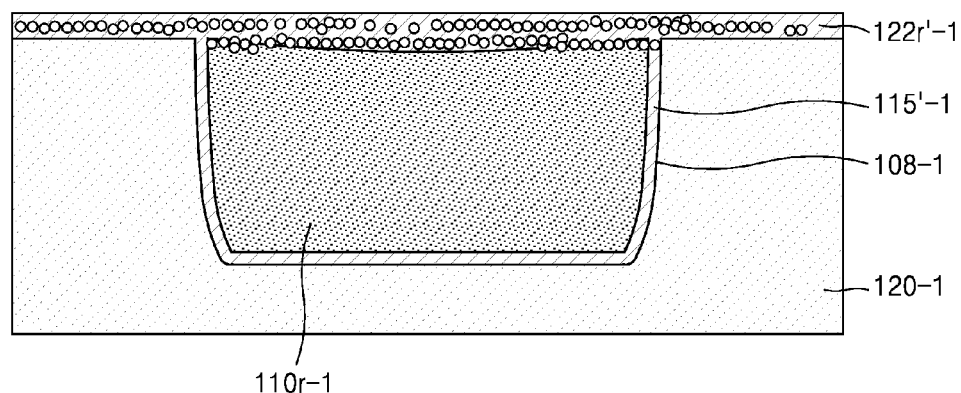
Figure 3D:
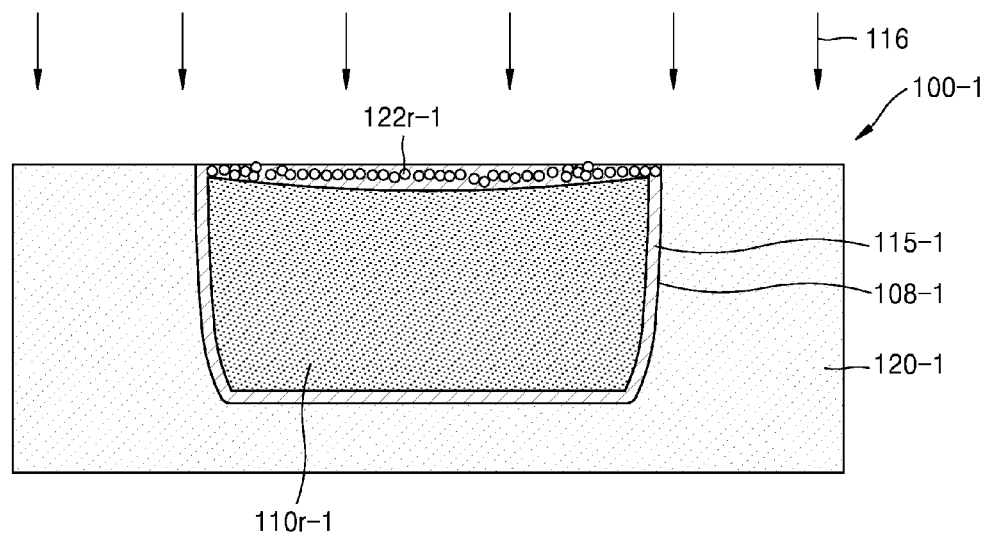

Referring to FIGS. 3C and 3D, a preliminary first seed layer 122r'-1 may be formed in the first insulating layer 120-1, the first barrier layer 115-1, and the recessed first conductive pad 110r-1 as illustrated in FIG. 3C. The preliminary first seed layer 122r'-1 may be formed on the recessed first conductive pad 110r-1. A material forming the preliminary first seed layer 122r'-1 may be the same as that of the preliminary first seed layer 122'-1 described above. FIG. 3C illustrates that the preliminary first seed layer 122r'-1 is formed of a plurality of metal atoms for convenience of following descriptions.

As illustrated in FIG. 3D, with the first insulating layer 120-1 as an etching blocking point, the preliminary first seed layer 122r'-1 may be flattened through a CMP process. Therefore, a first seed layer 122r-1 may be formed on the recessed first conductive pad 110r-1 and in the first via trench 108-1.

Next, in order to easily perform a following bonding process, plasma 116 may be irradiated to front sides of the first insulating layer 120-1 and the first seed layer 122r-1 by using argon gas or nitrogen gas. Therefore, upper surfaces of the first insulating layer 120-1 and the first seed layer 122r-1 may be plasma-activated surfaces. The first wafer 100-1 may be manufactured through the process.

Figure 3E:
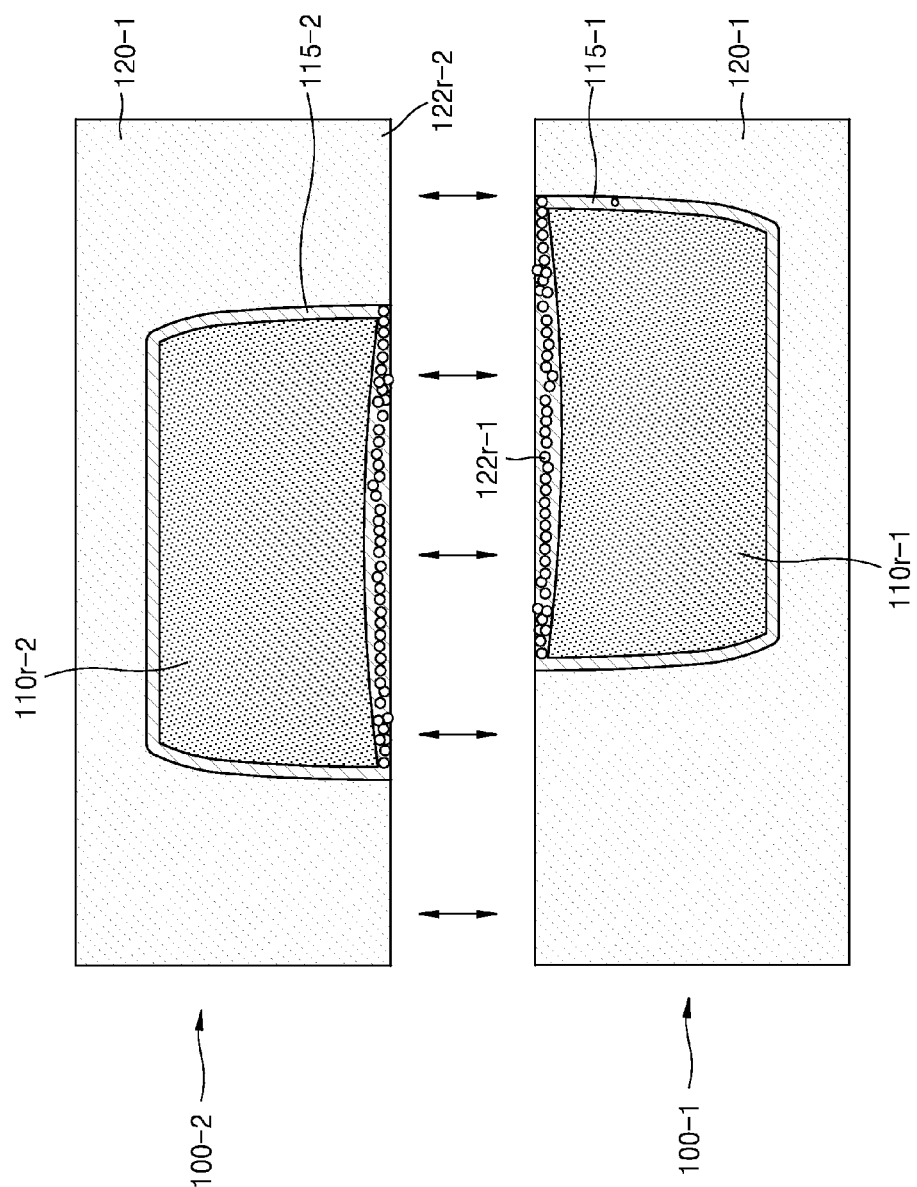

Referring to FIG. 3E, the second wafer 100-2 may be manufactured through the same process as those of FIGS. 3A to 3D. The second wafer 100-2 may include the second insulating layer 120-2, a recessed second conductive pad 110r-2, a second seed layer 122r-2, and the second barrier layer 115-2. The recessed first conductive pad 110r-1, the first seed layer 122r-1, and the first insulating layer 120-1 of the first wafer 100-1 may be bonded to the recessed second conductive pad 110r-2, the second seed layer 122r-2, and the second insulating layer 120-2 of the second wafer 100-2 to face one another. FIG. 3E illustrates the first and second wafers 100-1 and 100-2 facing each other.

Figure 3F:
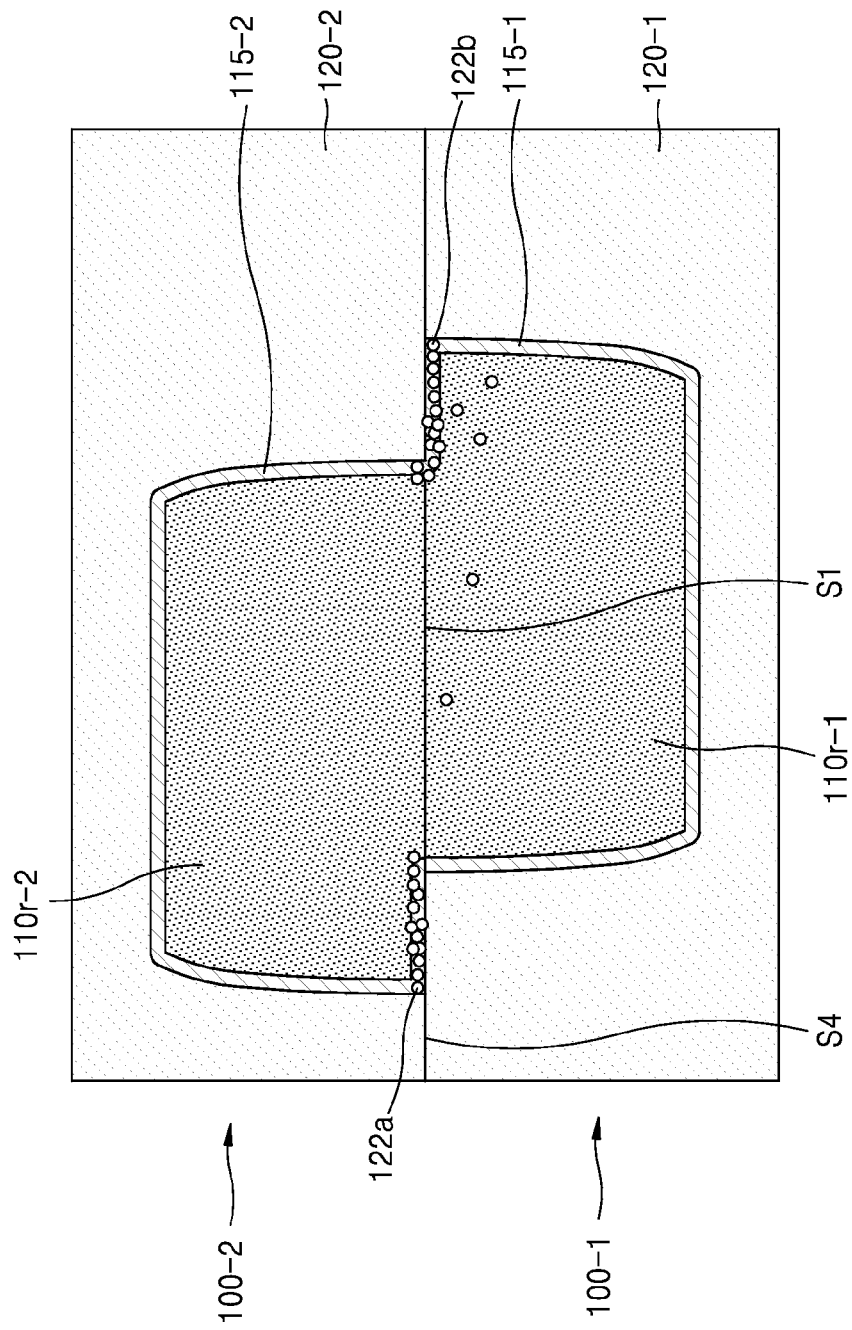

Referring to FIG. 3F, the recessed first conductive pad 110r-1, the first seed layer 122r-1, and the first insulating layer 120-1 of the first wafer 100-1 are bonded to the recessed second conductive pad 110r-2 and the second insulating layer 120-2 of the second wafer 100-2 to face one another, and a heat treatment is performed thereon.

The upper surface S2 of the recessed first conductive pad 110r-1 and the upper surface S2 of the recessed second conductive pad 110r-2 are bonded to each other, and the upper surface S4 of the first insulating layer 120-1 and the upper surface S4 of the second insulating layer 120-2 are bonded to each other.

Since the upper surface S2 of the recessed first conductive pad 110r-1 and the upper surface S2 of the recessed second conductive pad 110r-2 are stuck to each other, the recessed parts are not shown in FIG. 3F. When the recessed first conductive pad 110r-1 of the first wafer 100-1 is bonded to the recessed second conductive pad 110r-2 of the second wafer 100-2, the recessed first conductive pad 110r-1 of the first wafer 100-1 may be to one side, for example, to the right side of the recessed second conductive pad 110r-2 of the second wafer 100-2 and not accurately aligned therewith.

A heat treatment may be performed at a temperature at which bonding between the first and second insulating layers 120-1 and 120-2, and bonding between the recessed first and second conductive pads 110r-1 and 110r-2 may be performed. For example, a temperature of the heat treatment may be about 180° C. to 300° C. During the heat treatment, as illustrated in FIG. 3F, the third barrier layers 122a and 122b may be formed in a part where the recessed first and second conductive pads 110r-1 and 110r-2 are not bonded to each other, between the first and second wafers 100-1 and 100-2.

The third barrier layers 122a and 122b may be the self-forming barrier layer described above. The self-forming barrier layer forming the third barrier layers 122a and 122b may be formed by segregating metal atoms forming the first and second seed layers 122r-1 and 122r-2 after moving to a surface of the self-forming barrier layer and reaction of the metal atoms with the first and second insulating layers 120-1 and 120-2.

As described above, the third barrier layers 122a and 122b may reduce or prevent metal atoms included in the recessed first and second conductive pads 110r-1 and 110r-2, for example, Cu atoms from being diffused through the first and second insulating layers 120-1 and 120-2.

Figure 4:
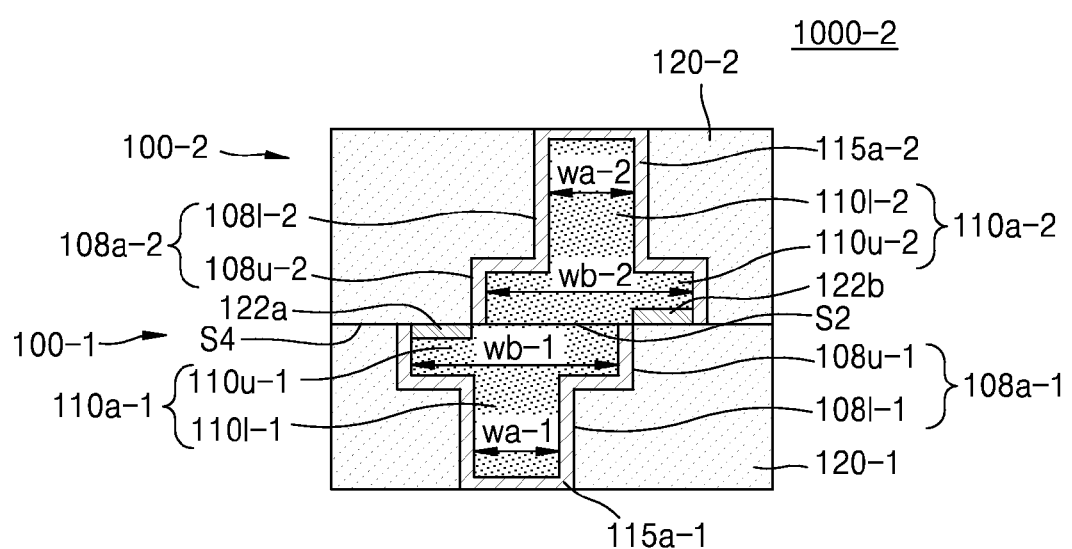
FIG. 4 is a main view illustrating a wafer-to-wafer bonding structure according to example embodiments of the inventive concepts.

FIG. 4 is a main view illustrating a wafer-to-wafer bonding structure 1000-2 according to example embodiments of the inventive concepts.

In more detail, the wafer-to-wafer bonding structure 1000-2 of FIG. 4 may be substantially the same as that of FIG. 1 except for structures of first and second via trenches 108a-1 and 108a-2, and first and second conductive pads 110a-1 and 110a-2. In FIG. 4, like reference numerals in FIG. 1 denote like elements, and repeated descriptions thereof are omitted for simplicity.

The first wafer 100-1 may include a first insulating layer 120-1, the first conductive pad 110a-1, and a first barrier layer 115a-1. The first via trench 108a-1 penetrating through the first insulating layer 120-1 may be formed in the first insulating layer 120-1. The first via trench 108a-1 may include a first upper via trench 108u-1 having a relatively large width and a first lower via trench 108l-1 having a relatively small width.

The first conductive pad 110a-1 may include a first upper conductive pad 110u-1 embedded in the first upper via trench 108u-1 and a first lower conductive pad 110l-1 embedded in the first lower via trench 108l-1. A width wb-1 of the first upper conductive pad 110u-1 may be greater than a width wa-1 of the first lower conductive pad 110l-1. The first barrier layer 115a-1 may surround lower surfaces and side surfaces of the first lower conductive pad 110l-1 and the first upper conductive pad 110u-1. A bottom surface of the first barrier layer 115a-1 may be exposed to the outside. The upper surface S2 of the first conductive pad 110a-1 and the upper surface S4 of the first insulating layer 120-1 may be flush with each other.

The second wafer 100-2 may include the second insulating layer 120-2, the second conductive pad 110a-2, and a second barrier layer 115a-2 corresponding to the first wafer 100-1. The second via trench 108a-2 penetrating through the second insulating layer 120-2 may be formed in the second insulating layer 120-2. The second via trench 108a-2 may include a second upper via trench 108u-2 having a relatively large width and a second lower via trench 108l-2 having a relatively small width.

The second conductive pad 110a-2 may include a second upper conductive pad 110u-2 embedded in the second upper via trench 108u-2 and a second lower conductive pad 110l-2 embedded in the second lower via trench 108l-2. A width wb-2 of the second upper conductive pad 110u-2 may be greater than a width wa-2 of the second lower conductive pad 110l-2. The width wb-2 of the second upper conductive pad 110u-2 forming the second conductive pad 110a-2 may be the same size as the width wb-1 of the first upper conductive pad 110u-1 forming the first conductive pad 110a-1. The second barrier layer 115a-2 may surround lower surfaces and side surfaces of the second lower conductive pad 110l-2 and the second upper conductive pad 110u-2. A bottom surface of the second barrier layer 115a-2 may be exposed to the outside. The upper surface S2 of the second conductive pad 110a-2 and the upper surface S4 of the second insulating layer 120-2 may be flush with each other.

The second insulating layer 120-2, the second conductive pad 110a-2, and the second barrier layer 115a-2 of the second wafer 100-2 may correspond to the first insulating layer 120-1, the first conductive pad 110a-1, and the first barrier layer 115a-1 of the first wafer 100-1, respectively. The second wafer 100-2 may be bonded to the first wafer 100-1. The upper surface S4 of the first insulating layer 120-1 and the upper surface S4 of the second insulating layer 120-2 between the first and second wafers 100-1 and 100-2 may be plasma-activated surfaces.

The third barrier layers 122a and 122b may be arranged in a part where the first and second conductive pads 110a-1 and 110a-2 are not bonded to each other, between the first and second wafers 100-1 and 100-2. As described above, the third barrier layers 122a and 122b may be around part of the first conductive pad 110a-1 and around part of the second conductive pad 110a-2. As described above, the third barrier layers 122a and 122b may reduce or prevent metal elements in the first and second conductive pads 110a-1 and 110a-2 from being diffused through the first and second insulating layers 120-1 and 120-2.

Figure 5A:
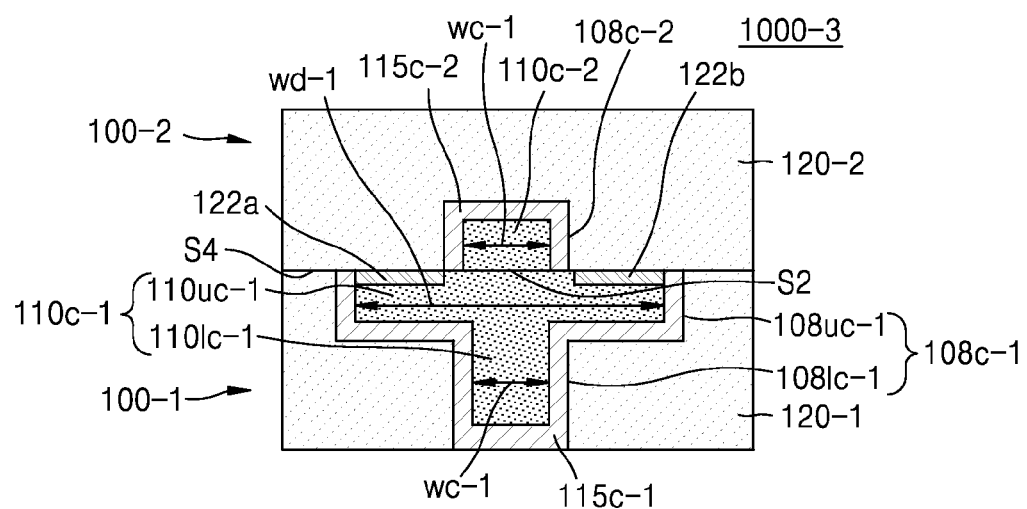
FIGS. 5A and 5B are main views illustrating a wafer-to-wafer bonding structure according to example embodiments of the inventive concepts.
Figure 5B:
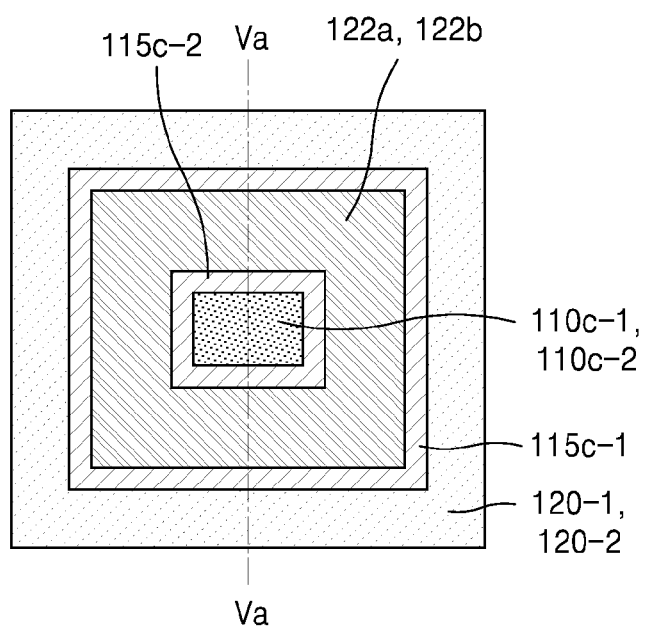

FIGS. 5A and 5B are main views illustrating a wafer-to-wafer bonding structure 1000-3 according to example embodiments of the inventive concepts.

In more detail, FIGS. 5A and 5B are a cross-sectional view and a transparent plan view of the wafer-to-wafer bonding structure 1000-3, respectively. FIG. 5A may be a cross-sectional view taken along a line Va-Va of FIG. 5B. In more detail, the wafer-to-wafer bonding structure 1000-3 of FIGS. 5A and 5B may be substantially the same as those of FIGS. 1 and 4 except for structures of first and second via trenches 108c-1 and 108c-2, and first and second conductive pads 110c-1 and 110c-2. In FIGS. 5A and 5B, like reference numerals in FIGS. 1 and 4 denote like elements, and repeated descriptions thereof are omitted for simplicity.

The first wafer 100-1 may include the first insulating layer 120-1, the first conductive pad 110c-1, and a first barrier layer 115c-1. The first via trench 108c-1 penetrating through the first insulating layer 120-1 may be formed in the first insulating layer 120-1. The first via trench 108c-1 may include a first upper via trench 108uc-1 having a relatively large width and a first lower via trench 108lc-1 having a relatively small width.

The first conductive pad 110c-1 may include a first upper conductive pad 110uc-1 embedded in the first upper via trench 108uc-1 and a first lower conductive pad 110lc-1 embedded in the first lower via trench 108lc-1. A width wd-1 of the first upper conductive pad 110uc-1 may be greater than a width wc-1 of the first lower conductive pad 110lc-1. The first barrier layer 115c-1 may surround a lower surface and side surfaces of the first conductive pad 110c-1. A bottom surface of the first barrier layer 115c-1 may be exposed to the outside. The upper surface S2 of the first conductive pad 110c-1 and the upper surface S4 of the first insulating layer 120-1 may be flush with each other.

The second wafer 100-2 may include the second insulating layer 120-2, the second conductive pad 110c-2, and a second barrier layer 115c-2 corresponding to the first wafer 100-1. The second via trench 108c-2 may be formed in the second insulating layer 120-2. The second conductive pad 110c-2 may be embedded in the second via trench 108c-2. The width wc-1 of the second conductive pad 110c-2 may be less than the width wd-1 of the first upper conductive pad 110uc-1 forming the first conductive pad 110c-1. The second barrier layer 115c-2 may surround a lower surface and side surfaces of the second conductive pad 110c-2. The upper surface S2 of the second conductive pad 110c-2 and the upper surface S4 of the second insulating layer 120-2 may be flush with each other.

The second insulating layer 120-2, the second conductive pad 110c-2, and the second barrier layer 115c-2 of the second wafer 100-2 may correspond to the first insulating layer 120-1, the first conductive pad 110c-1, and the first barrier layer 115c-1 of the first wafer 100-1, respectively. The second wafer 100-2 may be bonded to the first wafer 100-1. The upper surface S4 of the first insulating layer 120-1 and the upper surface S4 of the second insulating layer 120-2 between the first and second wafers 100-1 and 100-2 may be plasma-activated surfaces.

The third barrier layers 122a and 122b may be arranged in a part where the first and second conductive pads 110c-1 and 110c-2 are not bonded to each other, between the first and second wafers 100-1 and 100-2. As described above, the third barrier layers 122a and 122b may be around part of the first conductive pad 110c-1 and around part of the second conductive pad 110c-2. As described above, the third barrier layers 122a and 122b may reduce or prevent metal elements in the first and second conductive pads 110c-1 and 110c-2 from being diffused through the first and second insulating layers 120-1 and 120-2.

FIG. 6 is a main view illustrating a wafer-to-wafer bonding structure 1000-4 according to example embodiments of the inventive concepts.

In more detail, the wafer-to-wafer bonding structure 1000-4 may be substantially the same as that of FIG. 4 except for structures of first and second barrier layers 115d-1 and 115d-2, and including first and second multi-layered wiring layers 160-1 and 160-2. In FIG. 6, like reference numerals in FIG. 4 denote like elements, and repeated descriptions thereof are omitted for simplicity.

The first wafer 100-1 may include a first interlayer insulating layer 150-1, the first multi-layered wiring layer 160-1, the first insulating layer 120-1, the first conductive pad 110a-1, and the first barrier layer 115d-1. The first multi-layered wiring layer 160-1 may be formed in the first interlayer insulating layer 150-1. A first intermediate insulating layer 124-1, for example, a silicon carbonitride (SiCN) layer, may be formed on the first insulating layer 120-1.

The first via trench 108a-1 penetrating through the first insulating layer 120-1 may be formed in the first insulating layer 120-1. The first via trench 108a-1 may include a first upper via trench 108u-1 having a relatively large width and a first lower via trench 108l-1 having a relatively small width. The first conductive pad 110a-1 may include the first upper conductive pad 110u-1 embedded in the first upper via trench 108u-1 and the first lower conductive pad 110l-1 embedded in the first lower via trench 108l-1.

The first barrier layer 115d-1 may include a first lower barrier layer 115ld-1 surrounding a lower surface and side surfaces of the first lower conductive pad 110l-1, and a first upper barrier layer 115ud-1 surrounding a lower surface and side surfaces of the first upper conductive pad 110u-1. The first barrier layer 115d-1 may be electrically connected to the first multi-layered wiring layer 160-1. The upper surface S2 of the first conductive pad 110a-1 and the upper surface S4 of the first insulating layer 120-1 may be flush with each other.

The second wafer 100-2 may include a second interlayer insulating layer 150-2, the second multi-layered wiring layer 160-2, the second insulating layer 120-2, the second conductive pad 110a-2, and the second barrier layer 115d-2 corresponding to the first wafer 100-1. The second multi-layered wiring layer 160-2 may be formed in the second interlayer insulating layer 150-2. A second intermediate insulating layer 124-2, for example, a SiCN layer, may be formed on the second insulating layer 120-2.

The second via trench 108a-2 penetrating through the second insulating layer 120-2 may be formed in the second insulating layer 120-2. The second via trench 108a-2 may include a second upper via trench 108u-2 having a relatively large width and a second lower via trench 108l-2 having a relatively small width.

The second conductive pad 110a-2 may include a second upper conductive pad 110u-2 embedded in the second upper via trench 108u-2 and a second lower conductive pad 110l-2 embedded in the second lower via trench 108l-2. The second conductive pad 110a-2 may be the same width as the first conductive pad 110a-1.

The second barrier layer 115d-2 may include a second lower barrier layer 115ld-2 surrounding a lower surface and side surfaces of the second lower conductive pad 110l-2, and a second upper barrier layer 115ud-2 surrounding a lower surface and side surfaces of the second upper conductive pad 110u-2. The second barrier layer 115d-2 may be electrically connected to the second multi-layered wiring layer 160-2. The upper surface S2 of the second conductive pad 110a-2 and the upper surface S4 of the second insulating layer 120-2 may be flush with each other.

The second wafer 100-2 may be bonded to the first wafer 100-1. The upper surface S4 of the first insulating layer 120-1 and the upper surface S4 of the second insulating layer 120-2 between the first and second wafers 100-1 and 100-2 may be plasma-activated surfaces.

The third barrier layers 122a and 122b may be arranged in a part where the first and second conductive pads 110a-1 and 110a-2 are not bonded to each other, between the first and second wafers 100-1 and 100-2. As described above, the third barrier layers 122a and 122b may reduce or prevent metal elements in the first and second conductive pads 110a-1 and 110a-2 from being diffused through the first and second insulating layers 120-1 and 120-2.

Figure 7:
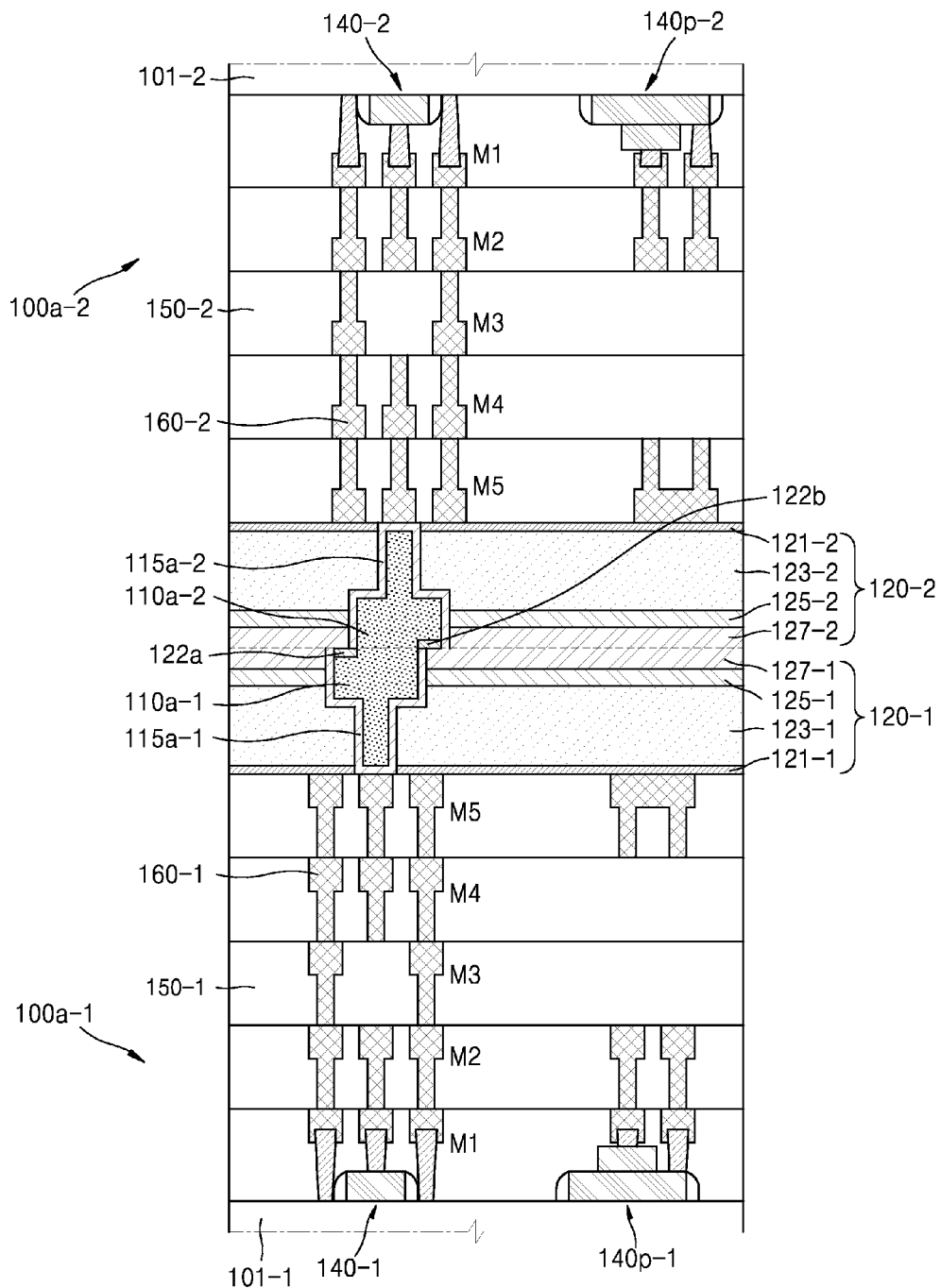
FIG. 7 is a main view illustrating a wafer-to-wafer bonding structure according to example embodiments of the inventive concepts.

FIG. 7 is a main view illustrating a wafer-to-wafer bonding structure 1000a according to example embodiments of the inventive concepts.

In more detail, the wafer-to-wafer bonding structure 1000a may be an actually realized example embodiment of the wafer-to-wafer bonding structure 1000-2 of FIG. 4. The wafer-to-wafer bonding structure 1000a shows a multi-layered wiring layer structure and an IC layer structure under first and second insulating layers 120-1 and 120-2.

A first wafer 100a-1 may include a first semiconductor layer 101-1, first IC layers 140-1 and 140p-1, the first interlayer insulating layer 150-1, the first multi-layered wiring layer 160-1, the first insulating layer 120-1, the first barrier layer 115a-1, and the first conductive pad 110a-1.

The first semiconductor layer 101-1 may be formed based on a group IV material wafer, or a group III-V compound wafer. Furthermore, the first semiconductor layer 101-1 may include a single crystal wafer such as a silicon single crystal wafer with respect to a forming method thereof. However, the first semiconductor layer 101-1 is not limited to a single crystal wafer, and may be formed based on various wafers such as an epitaxial wafer, a polished wafer, an annealed wafer, and a silicon on insulator (SOI) wafer. The first semiconductor layer 101-1 may include an impurity-doped well or an impurity-doped structure. Furthermore, the first semiconductor layer 101-1 may include various element isolation structures such as a shallow trench isolation (STI) structure.

The first IC layers 140-1 and 140p-1 may be formed on the first semiconductor layer 101-1, and may include various semiconductor devices, for example, a transistor, a diode, a resistor, or a capacitor. FIG. 7 illustrates a transistor representing an IC. The transistor may include, for example, a source/drain region, a channel region, or a gate structure formed on a first semiconductor layer. For example, a transistor included in the first IC layer 140-1 may be used in a memory device or a cell of an image sensor, and a transistor included in the first IC layer 140p-1 may be used in a logic element or a peripheral region.

The first IC layers 140-1 and 140p-1 may transmit and receive electrical signals to/from outside through the first multi-layered wiring layer 160-1. The electrical signals may include a power voltage, a ground voltage, or a signal voltage. The first multi-layered wiring layer 160-1 may include five wiring layers M1, M2, M3, M4, and M5. However, the number of wiring layers in the first multi-layered wiring layer 160-1 is not limited thereto. The number of wiring layers in the first multi-layered wiring layer 160-1 may be less than five or at least six.

The first interlayer insulating layer 150-1 may be formed on the first semiconductor layer 101-1, and may cover the first IC layers 140-1 and 140p-1 and the first multi-layered wiring layer 160-1. The first interlayer insulating layer 150-1 may include layers corresponding to the number of wiring layers in the first multi-layered wiring layer 160-1. When the first interlayer insulating layer 150-1 includes layers, the first interlayer insulating layer 150-1 may include a single material layer or at least two different material layers.

The first insulating layer 120-1 may be formed on the first interlayer insulating layer 150-1 and the first multi-layered wiring layer 160-1. The first insulating layer 120-1 may include a first lowermost insulating layer 121-1, a first lower insulating layer 123-1, a first intermediate insulating layer 125-1, and a first upper insulating layer 127-1. The first lower insulating layer 123-1 may include a tetraethyl orthosilicate (TEOS) layer, the first intermediate insulating layer 125-1 may include a SiCN layer, and the first upper insulating layer 127-1 may include a TEOS layer. However, materials of the first lower insulating layer 123-1, the first intermediate insulating layer 125-1, and the first upper insulating layer 127-1 are not limited thereto.

The first lowermost insulating layer 121-1 may include a SiCN layer and may reduce or prevent ion diffusion. The first lowermost insulating layer 121-1 may function as an etching blocking layer during an etching process of the first lower insulating layer 123-1. The first lowermost insulating layer 121-1 and the first intermediate insulating layer 125-1 may include a silicon dioxide ($SiO_2$) layer instead of a SiCN layer.

As illustrated above, a width of a lower portion of the first conductive pad 110a-1 may be less than that of an upper portion of the first conductive pad 110a-1. The structure of the first conductive pad 110a-1 may be formed by a dual damascene process. Since the dual damascene process is well-known to those of ordinary skill in the art, a detailed description thereof will not be given. As the upper portion of the first conductive pad 110a-1 is widely formed, contact resistance may be reduced while bonding conductive pads. Furthermore, as conductive pads are bonded to each other in a wider area, stronger bonding coupling may be maintained.

As described above, the first barrier layer 115a-1 may surround a lower surface and side surfaces of the first conductive pad 110a-1. Corresponding to that the width of the lower portion of the first conductive pad 110a-1 is less than that of the upper portion of the first conductive pad 110a-1, the first barrier layer 115a-1 may have a smaller interval in a lower portion and may have a larger interval in an upper portion.

Lower portions of the first conductive pad 110a-1 and the first barrier layer 115a-1 may be connected to an uppermost wiring layer M5 of the first multi-layered wiring layer 160-1 due to structural features of the first conductive pad 110a-1 and the first barrier layer 115a-1. As the small portions of the first conductive pad 110a-1 and the first barrier layer 115a-1 extend by penetrating through the first insulating layer 120-1, a lower surface of the first barrier layer 115a-1 may contact an upper surface of the uppermost wiring layer M5. Therefore, the first conductive pad 110a-1 may be electrically connected to the first multi-layered wiring layer 160-1 through the first barrier layer 115a-1.

A structure of the second wafer 100a-2 may be the same as that of the first wafer 100a-1 described above. The second wafer 100a-2 may include a second semiconductor layer 101-2, second IC layers 140-2 and 140p-2, the second interlayer insulating layer 150-2, the second multi-layered wiring layer 160-2, the second insulating layer 120-2, the second barrier layer 115a-2, and the second conductive pad 110a-2. The second insulating layer 120-2 may include a second lowermost insulating layer 121-2, a second lower insulating layer 123-2, a second intermediate insulating layer 125-2, and a second upper insulating layer 127-2.

The second semiconductor layer 101-2, the second IC layers 140-2 and 140p-2, and the second interlayer insulating layer 150-2 of the second wafer 100a-2 may correspond to the first semiconductor layer 101-1, the first IC layers 140-1 and 140p-1, and the first interlayer insulating layer 150-1 of the first wafer 100a-1, respectively. The second multi-layered wiring layer 160-2, the second insulating layer 120-2, the second barrier layer 115a-2, and the second conductive pad 110a-2 of the second wafer 100a-2 may correspond to the first multi-layered wiring layer 160-1, the first insulating layer 120-1, the first barrier layer 115a-1, and the first conductive pad 110a-1 of the first wafer 100a-1, respectively. Therefore, repeated descriptions thereof are omitted for simplicity.

The third barrier layers 122a and 122b may be arranged in a part where the first and second conductive pads 110a-1 and 110a-2 are not bonded to each other, between the first and second wafers 100a-1 and 100a-2. As described above, the third barrier layers 122a and 122b may reduce or prevent metal elements in the first and second conductive pads 110a-1 and 110a-2 from being diffused through the first and second insulating layers 120-1 and 120-2.

Figure 8:
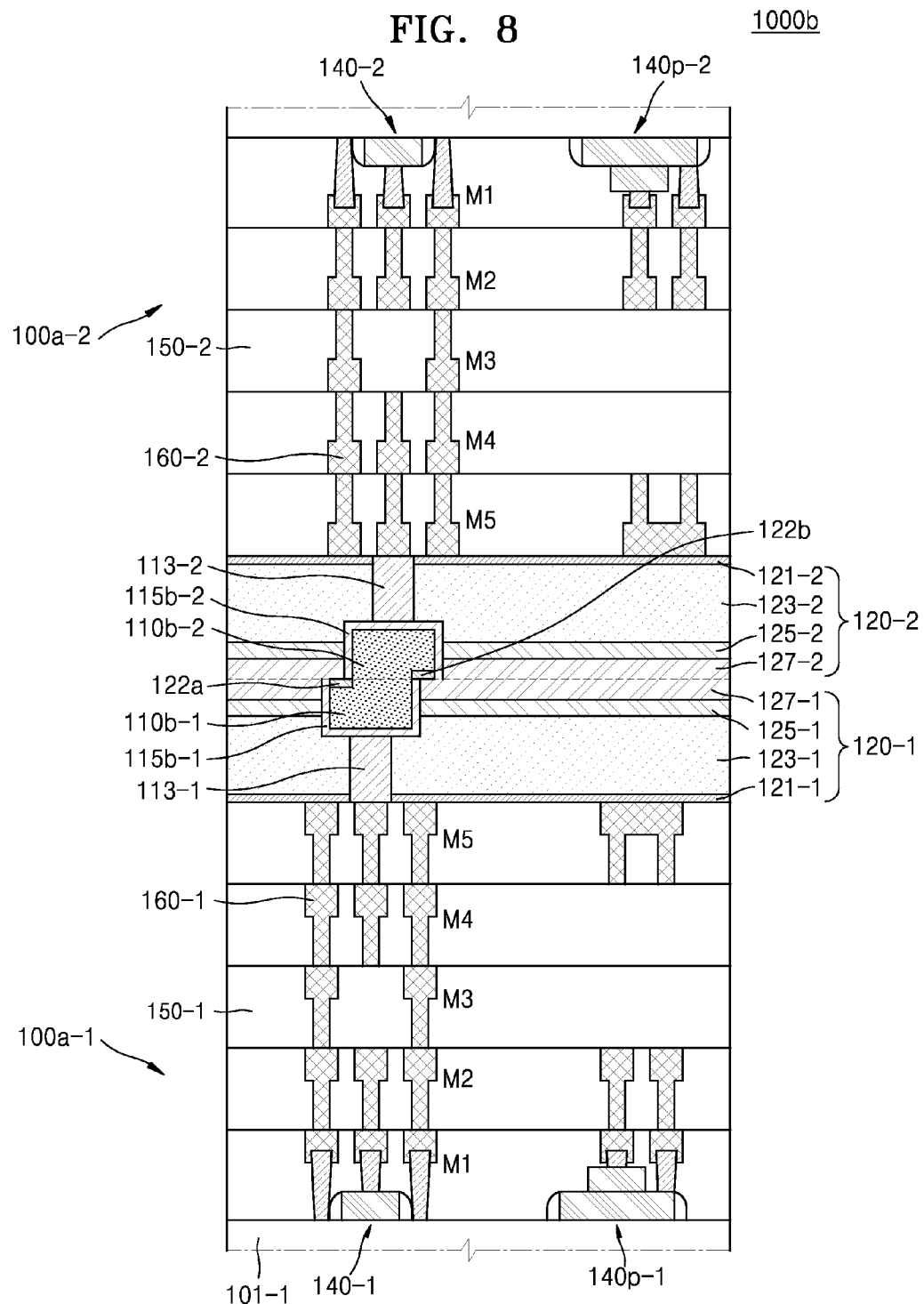
FIG. 8 is a main view illustrating a wafer-to-wafer bonding structure according to example embodiments of the inventive concepts.

FIG. 8 is a main view illustrating a wafer-to-wafer bonding structure 1000b according to example embodiments of the inventive concepts.

In more detail, the wafer-to-wafer bonding structure 1000b may be a variation of the wafer-to-wafer bonding structure 1000a of FIG. 7. The wafer-to-wafer bonding structure 1000b may be substantially the same as the wafer-to-wafer bonding structure 1000a of FIG. 7 except for conductive pads 110b-1 and 110b-2 and barrier layers 115b-1 and 115b-2. The wafer-to-wafer bonding structure 1000b may be substantially the same as the wafer-to-wafer bonding structure 1000a of FIG. 7 except for including first and second vertical contacts 113-1 and 113-2.

Lower portions and upper portions of the conductive pads 110b-1 and 110b-2 of the wafer-to-wafer bonding structure 1000b may have the same widths, respectively. The barrier layers 115b-1 and 115b-2 may surround lower surfaces and side surfaces of the conductive pads 110b-1 and 110b-2. Since the lower portions and upper portions of the conductive pads 110b-1 and 110b-2 and the barrier layers 115b-1 and 115b-2 are not distinguished by width, the conductive pads 110b-1 and 110b-2 and the barrier layers 115b-1 and 115b-2 may be formed by a single damascene process.

The wafer-to-wafer bonding structure 1000b may include the first and second vertical contacts 113-1 and 113-2. The first and second vertical contacts 113-1 and 113-2 may be metal contacts. The first vertical contact 113-1 may connect the uppermost wiring layer M5 of the first multi-layered wiring layer 160-1 of the first wafer 100a-1 to the first barrier layer 115b-1, and the second vertical contact 113-2 may connect the uppermost wiring layer M5 of the second multi-layered wiring layer 160-2 of the second wafer 100a-2 to the second barrier layer 115b-2.

In the wafer-to-wafer bonding structure 1000b, the first conductive pad 110b-1 may be electrically connected to the first multi-layered wiring layer 160-1 through the first barrier layer 115b-1 and the first vertical contact 113-1, and the second conductive pad 110b-2 may be electrically connected to the second multi-layered wiring layer 160-2 through the second barrier layer 115b-2 and the second vertical contact 113-2. Since the other components are already described above, a detailed description thereof will not be given.

Figure 9:
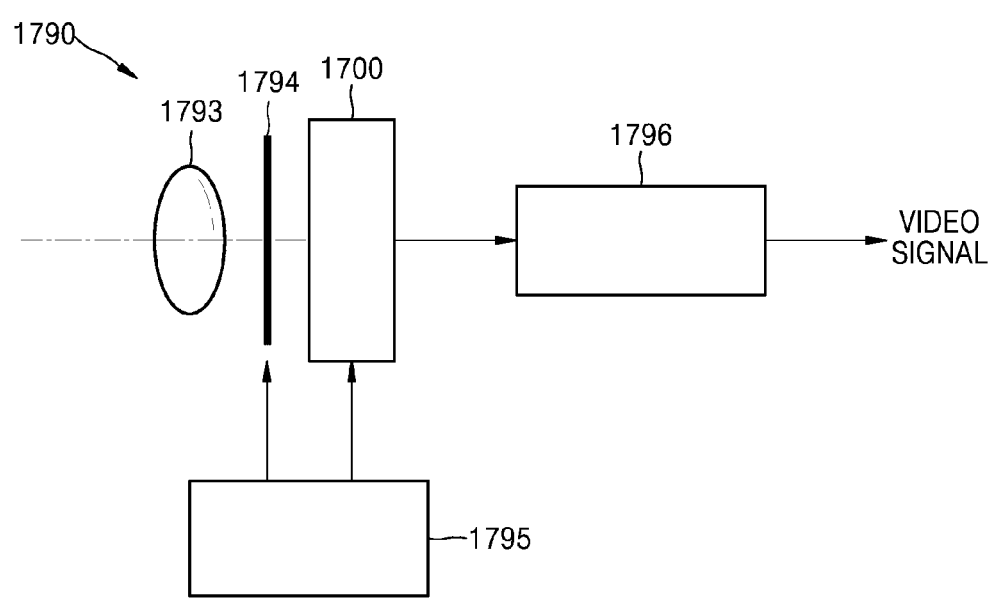
FIG. 9 is a configuration diagram of a camera using a wafer-to-wafer bonding structure according to example embodiments of the inventive concepts.

FIG. 9 is a configuration diagram of a camera using a wafer-to-wafer bonding structure according to example embodiments of the inventive concepts.

In more detail, a camera 1790 may include an image sensor 1700, an optical system 1793 guiding incident light to a light-receiving sensor of the image sensor 1700, a shutter device 1794, an operating circuit 1795 operating the image sensor 1700, and a signal processing circuit 1796 processing an output signal of the image sensor 1700.

The image sensor 1700 may be formed by using any of the wafer-to-wafer bonding structures in the above embodiments. The optical system 1793 including an optical lens may form an image on an imaging surface of the image sensor 1700 with an image light, that is, incident light from an object. As a result, signal charge is accumulated in the image sensor 1700 for a certain period of time.

The optical system 1793 may be an optical lens system including a plurality of optical lenses. The shutter device 1794 may control an irradiation period and a shielding period of light to the image sensor 1700. The operating circuit 1795 may supply the image sensor 1700 and the shutter device 1794 with an operating signal, and may control a signal output operation of the image sensor 1700 to the signal processing circuit 1796 and a shutter operation of the shutter device 1794 according to the supplied operating signal or a timing signal.

The operating circuit 1795 may perform a signal transmission operation from the image sensor 1700 to the signal processing circuit 1796 as the operating signal or the timing signal is supplied. The signal processing circuit 1796 may perform various signal processes on signals transmitted from the image sensor 1700. Image signals on which the signal processes are performed may be stored in a memory medium such as a memory or may be output to a monitor.

Figure 10:
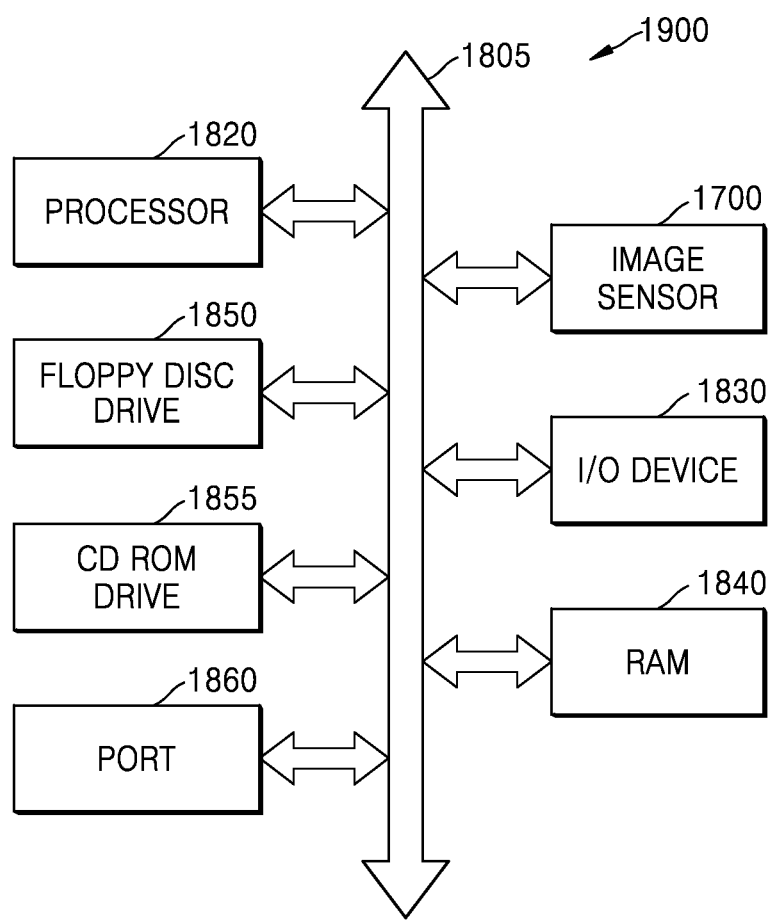
FIG. 10 is a block diagram of an electronic system including a wafer-to-wafer bonding structure according to example embodiments of the inventive concepts.

FIG. 10 is a block diagram of an electronic system 1900 including a wafer-to-wafer bonding structure according to example embodiments of the inventive concepts.

In more detail, the electronic system 1900 may be a system processing an output image of the image sensor 1700 described above. The image sensor 1700 may be formed by using any of the wafer-to-wafer bonding structures in the above embodiments. The electronic 1900 may be any kind of electronic systems on which the image sensor 1700 installed such as a computer system, a camera system, a scanner, and an image security system.

The electronic system 1900 like a computer system, which is processor-based, may include a microprocessor capable of communicating with an input/output (I/O) device 1830 through a bus 1805, or a processor 1820 such as a central processing unit (CPU). A floppy disc drive 1850, a compact disc-read only memory (CD-ROM) drive 1855, a port 1860, and random access memory (RAM) 1840 may be connected to one another through the processor 1820 and may transmit and receive data to/from the processor 1820 through the bus 1805, and thus, may reproduce an output image of data of the image sensor 1700. The RAM 1840 and the processor 1820 may be formed by using any of the wafer-to-wafer bonding structures in the above embodiments.

The port 1860 may couple a video card, a sound card, a memory card, or a universal serial bus (USB) device, or may exchange data with another system. The image sensor 1700 may be integrated together with processors such as a CPU, a digital signal processor (DSP), or a microprocessor, and may also be integrated together with a memory. In some cases, the image sensor 1700 may also be integrated in a separate chip regardless of processors. The electronic system 1900 may be a system such as a camera phone or a digital camera from among recent digital devices.

The wafer-to-wafer bonding structure according to example embodiments of the inventive concepts provides barrier layers around conductive pads so that metal elements included in the conductive pads may not be diffused through an adjacent insulating layer.

In other words, when bonding wafers including conductive pads, the wafer-to-wafer bonding structure according to example embodiments of the inventive concepts forms barrier layers around the conductive pads so that metal elements included in the conductive pads may not be diffused through an adjacent insulating layer.

As the metal elements included in the conductive pads are not diffused through the adjacent insulating layer, the wafer-to-wafer bonding structure according to example embodiments of the inventive concepts may improve leakage characteristics of a finally formed semiconductor chip.

It should be understood that example embodiments described herein should be considered in a descriptive sense only and not for purposes of limitation. Descriptions of features or aspects within each example embodiment should typically be considered as available for other similar features or aspects in other example embodiments. The example embodiments may be constituted by combining one or more.

While the inventive concepts have been particularly shown and described with reference to example embodiments thereof, it will be understood that various changes in form and details may be made therein without departing from the spirit and scope of the following claims.

What is claimed is:
1. A wafer-to-wafer bonding structure comprising:
a first wafer including a first conductive pad in a first insulating layer and a first barrier layer surrounding a lower surface and side surfaces of the first conductive pad;
a second wafer including a second conductive pad in a second insulating layer and a second barrier layer surrounding a lower surface and side surfaces of the second conductive pad, the second insulating layer being bonded to the first insulating layer, and at least a portion of an upper surface of the second conductive pad being partially or entirely bonded to at least a portion of an upper surface of the first conductive pad; and a third barrier layer only between portions of the first and second wafers where the first and second conductive pads are not bonded to each other, wherein the first conductive pad is a first recessed conductive pad and a first seed layer is on the first recessed conductive pad, and wherein the second conductive pad is a second recessed conductive pad and a second seed layer is on the second recessed conductive pad.

2. The wafer-to-wafer bonding structure of claim 1, wherein
the second conductive pad has the same width as the first conductive pad,
the third barrier layer is between portions of the second insulating layer and the first conductive pad that are not bonded to the second conductive pad, and
the third barrier layer is between portions of the first insulating layer and the second conductive pad that are not bonded to the first conductive pad.

3. The wafer-to-wafer bonding structure of claim 1, wherein
a width of the second conductive pad is less than that of the first conductive pad, and
the third barrier layer is between the second insulating layer and the first conductive pad that is not bonded to the second conductive pad.

4. The wafer-to-wafer bonding structure of claim 1, wherein the third barrier layer is around a portion of the first conductive pad and around a portion of the second conductive pad.

5. The wafer-to-wafer bonding structure of claim 1, wherein the third barrier layer is a self-forming barrier layer.

6. The wafer-to-wafer bonding structure of claim 1, wherein
the first and second conductive pads include copper (Cu), and
the first and second insulating layers include silicon oxide.

7. The wafer-to-wafer bonding structure of claim 6, wherein
the third barrier layer includes silicon and a metal more prone to oxidize than Cu.

8. The wafer-to-wafer bonding structure of claim 1, wherein an upper surface of the first insulating layer and an upper surface of the second insulating layer are plasma-activated surfaces.

9. The wafer-to-wafer bonding structure of claim 1, wherein
the first conductive pad includes a first lower conductive pad and a first upper conductive pad, and the first barrier layer surrounds lower surfaces and side surfaces of the first lower conductive pad and the first upper conductive pad, and
the second conductive pad includes a second lower conductive pad and a second upper conductive pad, and the second barrier layer surrounds lower surfaces and side surfaces of the second lower conductive pad and the second upper conductive pad.

10. The wafer-to-wafer bonding structure of claim 1, wherein
the first conductive pad includes a first lower conductive pad and a first upper conductive pad, the first barrier layer includes a first lower barrier layer and a first upper barrier layer, the first lower barrier layer surrounding lower surfaces and side surfaces of the first lower conductive pad and the first upper barrier layer surrounding lower surfaces and side surfaces of the first upper conductive pad, and
the second conductive pad includes a second lower conductive pad and a second upper conductive pad, the second barrier layer includes a second lower barrier layer and a second upper barrier layer, the second lower barrier layer surrounding lower surfaces and side surfaces of the second lower conductive pad and the second upper barrier layer surrounding lower surfaces and side surfaces of the second upper conductive pad.

11. The wafer-to-wafer bonding structure of claim 1, wherein
the first conductive pad includes a first lower conductive pad and a first upper conductive pad, the first upper conductive pad having a width greater than a width of the first lower conductive pad, and
the second conductive pad includes a second lower conductive pad and a second upper conductive pad, the second upper conductive pad having a width greater than a width of the second lower conductive pad.

12. The wafer-to-wafer bonding structure of claim 1, wherein
the first wafer further comprises a first multi-layered wiring layer, the first insulating layer is on the first multi-layered wiring layer, and the first conductive pad is electrically connected to the first multi-layered wiring layer through a first vertical contact in the first insulating layer, and
the second wafer further comprises a second multi-layered wiring layer, the second insulating layer is on the second multi-layered wiring layer, and the second conductive pad is electrically connected to the second multi-layered wiring layer through a second vertical contact in the second insulating layer.

13. A wafer-to-wafer bonding structure comprising:
a first wafer including,
a first semiconductor layer,
a first multi-layered wiring layer on the first semiconductor layer,
a first insulating layer on the first multi-layered wiring layer,
a first conductive pad penetrating the first insulating layer, and
a first barrier layer surrounding the first conductive pad; and
a second wafer including,
a second insulating layer on the first insulating layer, the second insulating layer bonded to the first insulating layer,
a second conductive pad penetrating the second insulating layer and bonded to a portion of the first conductive pad,
a second barrier layer surrounding the second conductive pad,
a second multi-layered wiring layer on the second insulating layer and the second conductive pad, and
a second semiconductor layer on the second multi-layered wiring layer; and
a third barrier layer only between the first and second wafers where the first and second conductive pads not bonded to each other,
wherein the first conductive pad is a first recessed conductive pad and a first seed layer is on the first recessed conductive pad, and wherein the second conductive pad is a second recessed conductive pad and a second seed layer is on the second recessed conductive pad.

14. The wafer-to-wafer bonding structure of claim 13, wherein
the first barrier layer is on a lower surface of the first conductive pad, and the first conductive pad is electrically connected to the first multi-layered wiring layer through the first barrier layer, and
the second barrier layer is on an upper surface of the second conductive pad, and the second conductive pad is electrically connected to the second multi-layered wiring layer through the second barrier layer.

15. The wafer-to-wafer bonding structure of claim 13, wherein
the third barrier layer is between the second insulating layer and the first conductive pad that is not bonded to the second conductive pad, and between the first insulating layer and the second conductive pad that is not bonded to the first conductive pad, or
the third barrier layer is between the second insulating layer and the first conductive pad that is not bonded to the second conductive pad.

16. A bonding structure comprising:
a first wafer including a first insulating layer and a first conductive pad embedded in the first insulating layer;
a second wafer bonded to the first wafer, the second wafer including a second insulating layer and a second conductive pad embedded in the second insulating layer, the second conductive pad overlapping a portion of the first conductive pad such that the first and second conductive pads are not vertically aligned; and
a barrier metal layer only on an interface between the first and second wafers where the first and second conductive pads do not overlap,
wherein the first conductive pad is a first recessed conductive pad and a first seed layer is on the first recessed conductive pad, and
wherein the second conductive pad is a second recessed conductive pad and a second seed layer is on the second recessed conductive pad.

17. The bonding structure of claim 16, wherein
the second conductive pad has the same width as the first conductive pad,
the barrier metal layer is between the second insulating layer and the portion of the first conductive pad that is not overlapped by the second conductive pad, and
the barrier metal layer is between the first insulating layer and the portion of the second conductive pad not overlapping the first conductive pad.

18. The bonding structure of claim 16, wherein
a width of the second conductive pad is less than that of the first conductive pad, and
the barrier metal layer is between the second insulating layer and the portion of the first conductive pad that is not overlapped by the second conductive pad.

19. The bonding structure of claim 16, wherein
the first and second conductive pads include copper (Cu),
the barrier metal layer includes MnSiO or AlSiO, and
the first and second insulating layers include silicon oxide.

20. The bonding structure of claim 16, wherein
the first wafer further comprises a first metal layer surrounding a lower surface and side surfaces of the first conductive pad,
the second wafer further comprises a second metal layer surrounding a lower surface and side surfaces of the second conductive pad, and
each of the first and second metal layers include titanium (Ti), tantalum (Ta), titanium nitride (TiN), or tantalum nitride (TaN).

* * * * *